US012671426B2

(12) United States Patent
Gruber et al.

(10) Patent No.: US 12,671,426 B2
(45) Date of Patent: Jun. 30, 2026

(54) SEGMENTED DIGITAL-TO-ANALOG CONVERTER WITH DIGITAL SEGMENT MISMATCH CORRECTION AND SUBTRACTIVE SEGMENT MISMATCH DITHERING

(71) Applicant: Intel Corporation, Santa Clara, CA (US)

(72) Inventors: Daniel Gruber, St. Andrae (AT); Michael Kalcher, Villach (AT); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/147,717

(22) Filed: Dec. 29, 2022

(65) Prior Publication Data

US 2024/0223198 A1 Jul. 4, 2024

(51) Int. Cl.
H03M 1/10 (2006.01)
(52) U.S. Cl.
CPC ..................................... H03M 1/10 (2013.01)
(58) Field of Classification Search
CPC ............ H03M 1/10; H03M 1/66; H03M 1/68; H03M 1/74; H03M 1/0641; H03M 1/0656; H03M 1/1033; H03M 1/06; H03M 1/066; H03M 1/0665; H03M 1/745; H03M 1/743; H03M 1/109
See application file for complete search history.

(56) References Cited

U.S. PATENT DOCUMENTS

| | | | | |
|---|---|---|---|---|
| 5,963,157 A | * | 10/1999 | Smith | H03M 1/0641 |
| | | | | 341/131 |
| 6,518,899 B2 | * | 2/2003 | Yu | H03M 1/0668 |
| | | | | 341/120 |
| 7,173,552 B1 | * | 2/2007 | Garcia | H03M 1/0678 |
| | | | | 341/120 |
| 9,337,854 B1 | * | 5/2016 | Chen | H03M 1/0673 |
| 9,432,044 B1 | * | 8/2016 | Lee | H03M 1/1061 |
| 9,871,531 B1 | * | 1/2018 | Fang | H03M 1/68 |
| 9,941,897 B1 | * | 4/2018 | Li | H03M 1/201 |
| 9,991,900 B1 | * | 6/2018 | Kabir | H03M 1/0673 |

(Continued)

OTHER PUBLICATIONS

Brannon, B. (1995). Overcoming Converter Nonlinearities with Dither, 1995. Analog Devices, Application Note AN-410.
(Continued)

*Primary Examiner* — Lam T Mai
(74) *Attorney, Agent, or Firm* — 2SPL Patent Attorneys PartG mbB; Yong Beom Hwang

(57) ABSTRACT

A segmented digital-to-analog converter (DAC). The segmented DAC includes at least two DAC segments. The DAC includes at least one overrange DAC configured to generate a dither subtraction signal based on an overrange DAC control data, and a dither control circuit configured to add a dither to the input data for the segmented DAC and generate the overrange DAC control data to compensate the dither. The dither subtraction signal is combined with the output signals of the DAC segments in an analog domain. The DAC includes a segment mismatch correction circuit configured to modify the input data for the segmented DAC or input data for at least one segment to correct a mismatch error of one or more of the segments and/or the at least one overrange DAC.

20 Claims, 22 Drawing Sheets

(56) References Cited

U.S. PATENT DOCUMENTS

| | | | | |
|---|---|---|---|---|
| 10,020,817 | B1 * | 7/2018 | Zhang | H03M 3/502 |
| 10,090,854 | B1 * | 10/2018 | Clara | H03M 1/70 |
| 10,305,505 | B1 * | 5/2019 | Zhang | H03M 1/68 |
| 10,720,938 | B2 * | 7/2020 | Zhang | H03M 1/661 |
| 10,790,850 | B1 * | 9/2020 | Lin | H03M 3/33 |
| 10,965,302 | B1 * | 3/2021 | Zhao | H03M 7/165 |
| 11,128,310 | B1 * | 9/2021 | Zhao | H03M 1/1071 |
| 11,637,560 | B2 * | 4/2023 | Clara | H03M 1/0639 |
| | | | | 341/120 |
| 2002/0190884 | A1 * | 12/2002 | Yu | H03M 1/0668 |
| | | | | 341/144 |
| 2020/0304138 | A1 * | 9/2020 | Zhang | H03M 3/38 |
| 2022/0200617 | A1 * | 6/2022 | Clara | H03M 1/1014 |
| 2022/0271771 | A1 * | 8/2022 | Zheng | H03M 1/68 |
| 2022/0345143 | A1 | 10/2022 | Gruber et al. | |
| 2024/0039548 | A1 * | 2/2024 | Sun | H03M 1/0653 |

OTHER PUBLICATIONS

Clara, M., Klatzer, W., Gruber, D., & Pribyl, W. (2008). A 1.5V 13bit 130-300MS/s Self-calibrated DAC with Active Output Stage and 50MHz Signal Bandwidth in 0.13um CMOS. European Solid-State Circuits Conference, (pp. 262-265).

Doris, K., Van Roermund, A., & Leenaerts, D. (2003). Mismatch-based Timing Errors in Current-Steering DACs. Proceedings of the 2003 International Symposium on Circuits and Systems, (pp. I/997-1/980).

Eielsen, A. A., & Fleming, A.J. (2017). Improving Digital-to-Analog Converter Linearity by Large High-Frequency Dithering. IEEE Transactions on Circuits and Systems—I, vol. 64, No. 6, 2017, 1409-1420.

Clara, M., Klatzer, W., Seger, B., Di Giandomenico, A., & Gori, L. (2007). A 1.5V 200MS/s 13b 25mW DAC with Randomized Nested Background Calibration in 0.13um CMOS. IEEE International Solid-State Circuits Conference, (pp. 250-251).

* cited by examiner

600

610

DAC segments

Dither
control
circuit

630

Overrange DAC

620

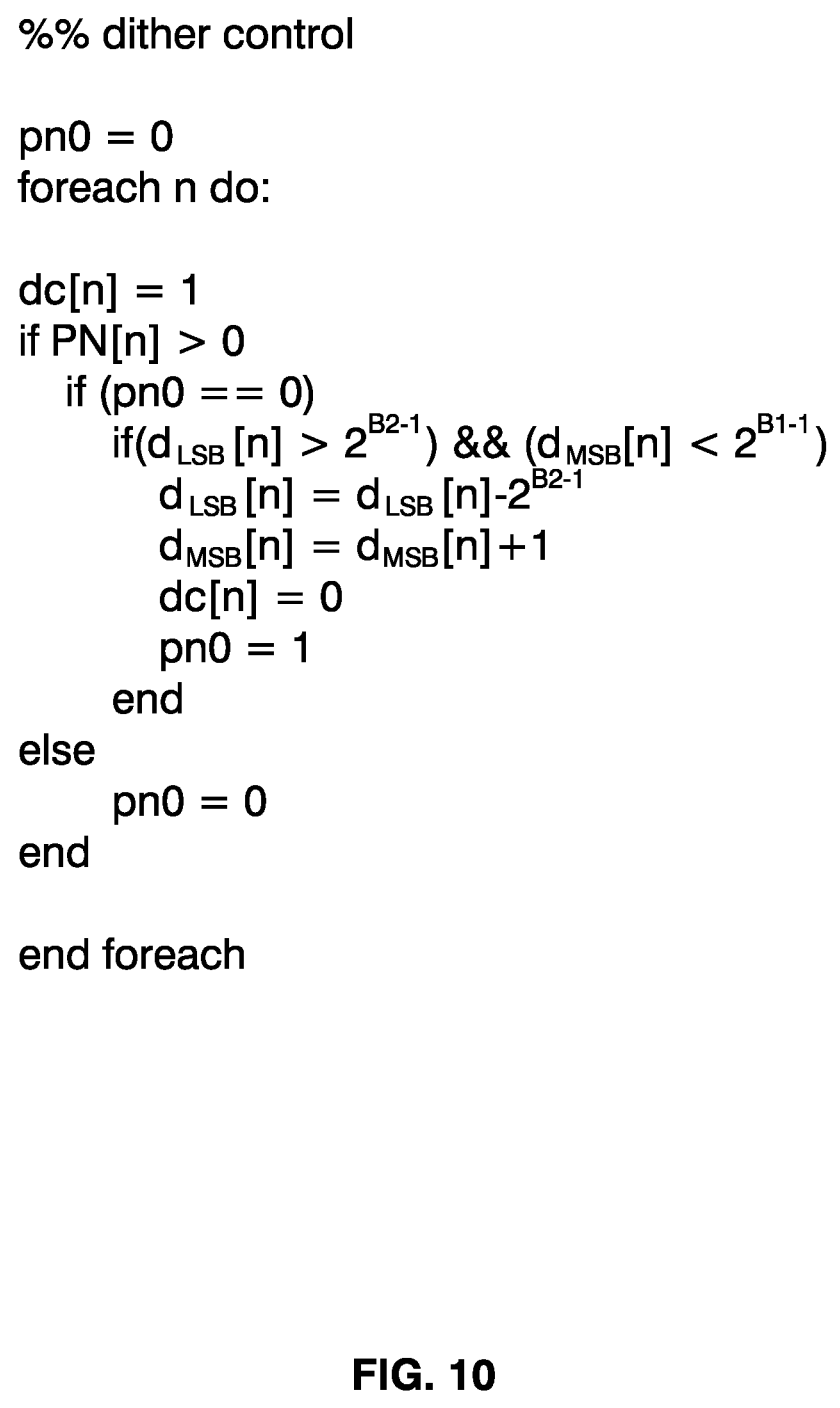

```
%% dither control pn0 = 0
foreach n do:

dc[n] = 1
if PN[n] > 0
    if (pn0 == 0)
        if(d_LSB[n] > 2^{B2-1}) && (d_MSB[n] < 2^{B1-1})
            d_LSB[n] = d_LSB[n]-2^{B2-1}
            d_MSB[n] = d_MSB[n]+1
            dc[n] = 0
            pn0 = 1
        end
else
        pn0 = 0
end end foreach
```

FIG. 10

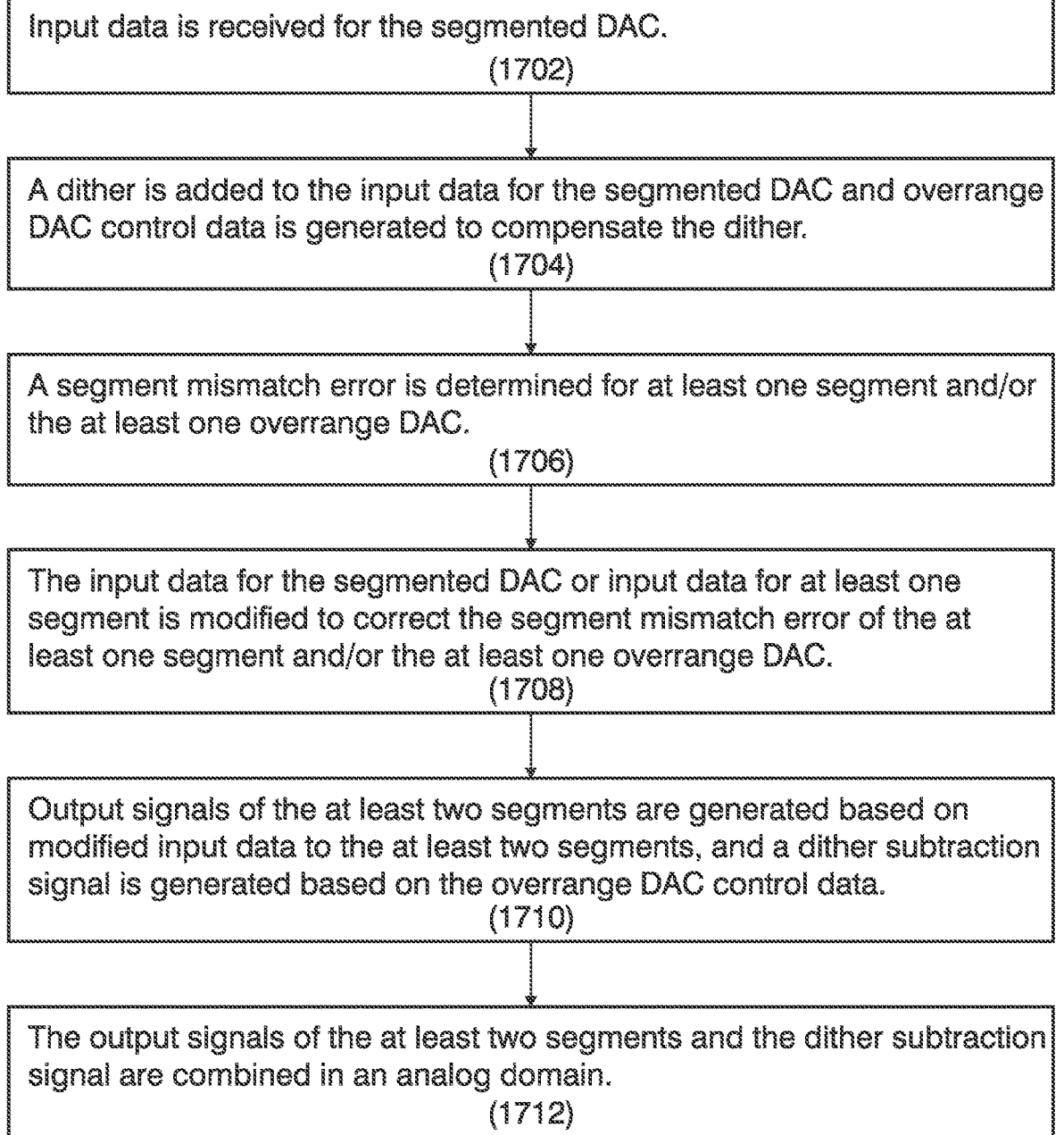

Input data is received for the segmented DAC.
(1702)

A dither is added to the input data for the segmented DAC and overrange DAC control data is generated to compensate the dither.
(1704)

A segment mismatch error is determined for at least one segment and/or the at least one overrange DAC.
(1706)

The input data for the segmented DAC or input data for at least one segment is modified to correct the segment mismatch error of the at least one segment and/or the at least one overrange DAC.
(1708)

Output signals of the at least two segments are generated based on modified input data to the at least two segments, and a dither subtraction signal is generated based on the overrange DAC control data.
(1710)

The output signals of the at least two segments and the dither subtraction signal are combined in an analog domain.
(1712)

FIG. 17

SEGMENTED DIGITAL-TO-ANALOG CONVERTER WITH DIGITAL SEGMENT MISMATCH CORRECTION AND SUBTRACTIVE SEGMENT MISMATCH DITHERING

BACKGROUND

A segmented digital-to-analog converter (DAC) includes two or more segments of sub-DACs. In a segmented DAC, errors between different DAC segments (i.e., inter-segment errors) cause non-linear distortion. For large (close to full-scale) narrowband signals, this error is often perceived as an increase in noise floor, while for broadband signals or heavily backed-off signals (narrowband and broadband), a non-linear and harmonic distortion is increased at the converter output. Many modern communication systems require a spectrally pure signal even in deep digital back-off, e.g., in cable modems, wireless base station transmitters, and others.

BRIEF DESCRIPTION OF THE FIGURES

Some examples of apparatuses and/or methods will be described in the following by way of example only, and with reference to the accompanying figures, in which

FIG. 10 shows an example algorithm for digital processing to remove any residual correlation between the dither and the input data in case of 2-segment DAC of FIG. 9;

FIG. 17 is a flow diagram of an example method for digital-to-analog conversion using a segmented DAC;

DETAILED DESCRIPTION

Figure 1:
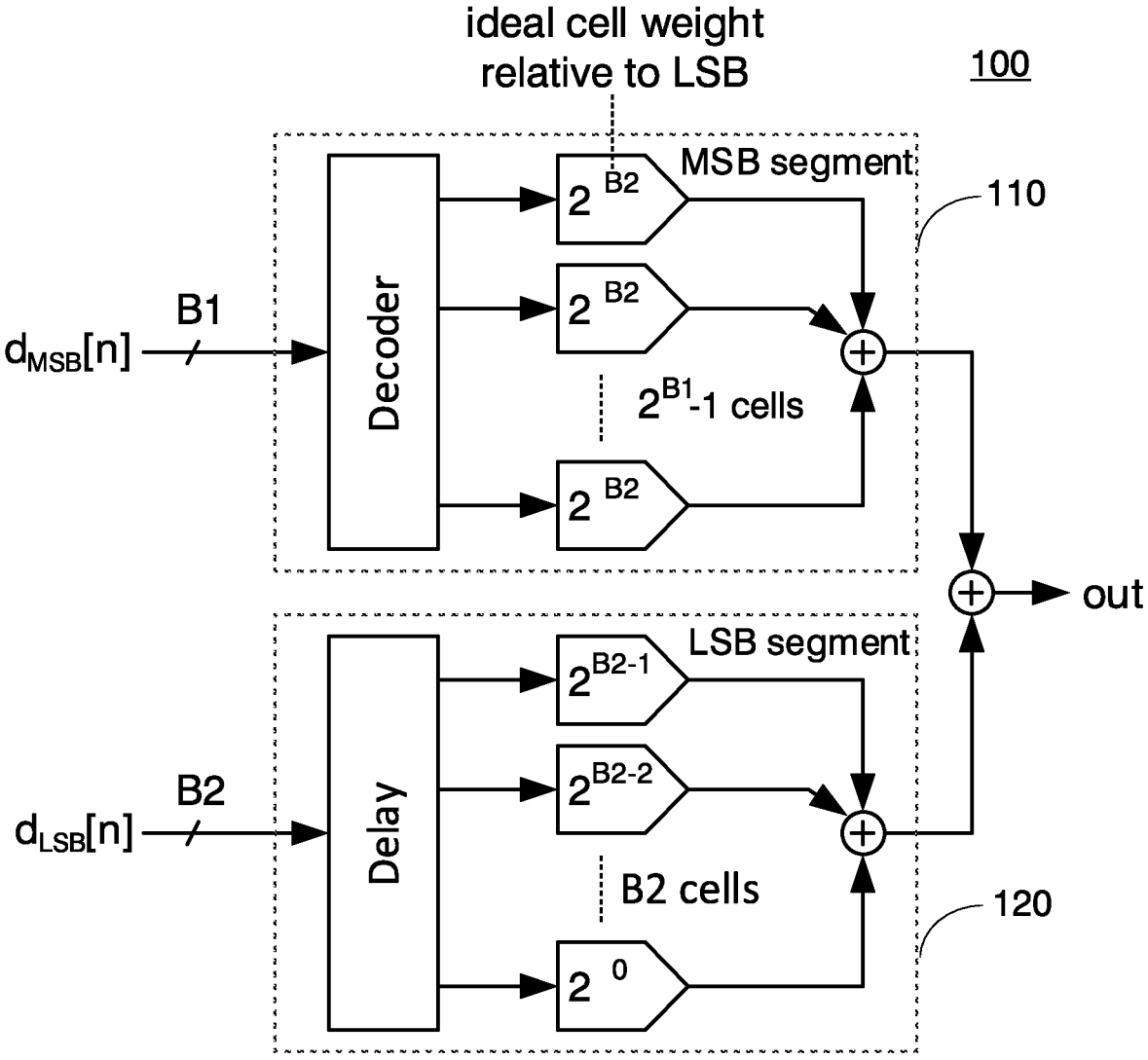
FIG. 1 shows an example 2-segment DAC.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Hereafter, the terms "segmented DAC" and "DAC" will be used interchangeably.

The inter-segment errors of a segmented DAC are mainly caused by the physical size difference of the DAC cells in different segments, i.e., given by the different sizing of circuit elements needed for different DAC cell weights. The inter-segment errors can be related to static errors, e.g., due to cell weight differences or dynamic errors e.g., due to timing or AC-output impedance differences. The mismatch between equal-sized elements in thermometer-coded segments (intra-segment mismatch) can be mitigated in the digital domain by special redundant switching sequence algorithms, commonly called Dynamic Element Matching (DEM). The randomizing switching algorithms only operate within a particular segment, and therefore are generally not able to correct inter-segment errors.

Achieving sufficient accuracy across segment boundaries also proves difficult even when element-wise calibration across segments is employed. To correctly calibrate the individual cells, multiple calibration references, which are accordingly scaled with great accuracy to match the different physical cell sizes of the DAC segments, are required. This scheme not only adds a significant overhead in analog circuitry, but also greatly complicates the integration of the calibration into the system. Conventionally, the reference cell for (weight) calibration is a copy of a unit DAC cell from either the highest (most significant bit (MSB)) segment, or, in a 3-segment DAC, a particular number of unit reference cells equal to a unit DAC cell from the intermediate (intermediate significant bit (ISB)) segment, whose sum matches the unit DAC cell from the next higher (MSB) segment. In practice, these multiple individual unit reference cells will also be affected by mismatch, and should therefore be calibrated amongst themselves, which makes the calibration procedure somewhat complicated.

Furthermore, even if the weight matching problem can be solved, for sufficiently high sampling rates and signal frequencies, dynamic mismatches (e.g., timing mismatches) may easily become the dominant error class. All this can make the inter-segment errors the dominant source of non-linearity in a DAC, especially for wideband signal synthesis applications and/or applications demanding a high digital gain range, which in turn directly leads to deep digital back-off situations, irrespective of the actual signal characteristics.

Adequate matching may be provided through mismatch-driven sizing. However, this method drastically increases the area and power dissipation. Alternatively, the individual DAC elements of the full DAC array may be calibrated with special care to eliminate inter-segment gain mismatches. This method drastically increases calibration complexity and design effort (circuitry, system, algorithms). Alternatively, the inter-segment gain error may be measured and corrected digitally by special digital processing of at least one of the segmented input data streams. This method requires an accurate measurement of the inter-segment errors. Moreover, $\Delta\Sigma$-modulation of the lower segment data stream may only be applicable if the DAC operates with a sufficiently high over-sampling ratio due to the out-of-band noise generated by this type of digital processing.

FIG. 1 shows an example 2-segment DAC 100. The segmented DAC 100 includes an upper segment (the MSB segment) 110 and a lower segment (the LSB segment) 120. The segmented DAC 100 has a physical resolution of B bits (B=B1+B2). In this example, the lower segment 120 (the LSB segment) is binary-coded with a resolution of B2 bits. The lower segment 120 includes B2 binary-weighted DAC cells, LSB(0) to LSB(B2-1), with binary-scaled weights of $2^0$ to $2^{B2-1}$. In this example, the upper segment 110 is thermometer-coded with a resolution of B1 bits. The upper segment 110 includes $2^{B1}-1$ equal-sized DAC cells with the same weight of $2^{B2}$.

The outputs of the lower segment 120 and the upper segment 110 are combined as an output of the segmented DAC. The actual DAC cell scaling within the individual DAC segments 110, 120 is not important for the consideration of inter-segment errors. The example in FIG. 1 shows a two-segment DAC with a thermometer-coded upper segment 110, and a binary-coded lower segment 120. However, both segments 110, 120 may be either thermometer-coded or binary-coded. Alternatively, the segments 110, 120 may employ an entirely different cell weight arrangement. The occurrence of an inter-segment error means that the DAC cell properties do not scale accurately from one segment to the next. For example, the weight of all DAC cells in a particular segment may be off by the same (relative) amount, although the relative matching of all DAC cells within the same segment may still be accurate.

Figure 2:
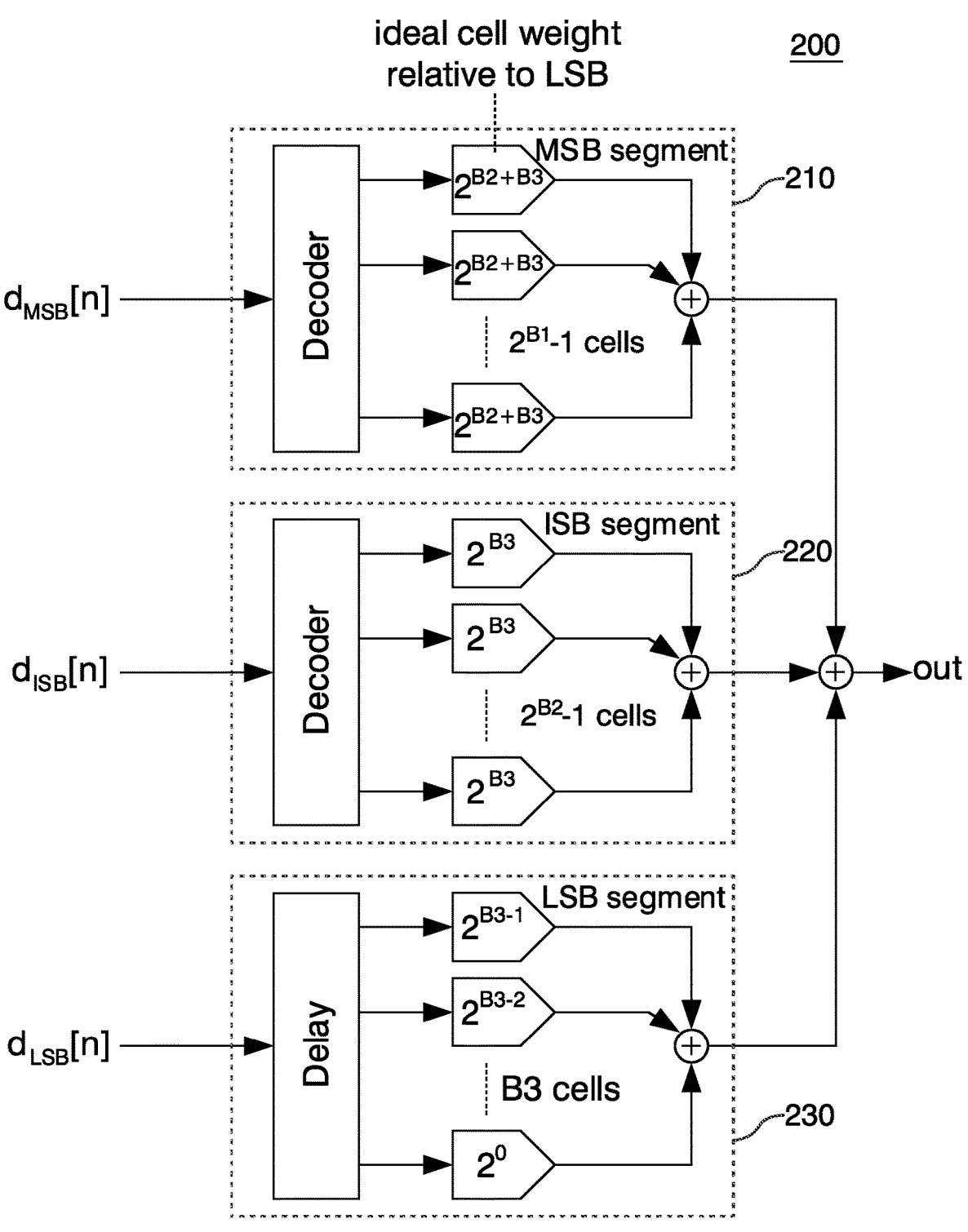
FIG. 2 shows an example 3-segment DAC with two thermometer-coded upper segments and a binary-coded lowest segment.

Segmented DACs may have more than two segments. FIG. 2 shows an example 3-segment DAC 200 with two thermometer-coded upper segments (the MSB segment and the ISB segment) 210, 220 and a binary-coded lowest segment (the LSB segment) 230. Typically, a 3-segment DAC uses thermometer coding for the two uppermost segments (the MSB segment and the ISB segment) 210, 220 and uses binary coding for the lowest segment (the LSB segment) 230. However, all or any one of the segments 110, 120, 130 may be thermometer-coded or binary-coded or may employ an entirely different cell weight arrangement. The segmented DAC 200 in FIG. 2 has a physical resolution of B bits (B=B1+B2+B3). The lower segment (the LSB segment) 230 is binary-coded with a resolution of B3 bits. The middle segment (the ISB segment) 220 is thermometer-coded with a resolution of B2 bits. The upper segment (the MSB segment) 210 is thermometer-coded with a resolution of B1 bits.

The inter-segment errors are not only restricted to an inaccuracy of the cell weights, but also comprise systematic timing errors between segments. More generally, any difference, static or dynamic, in the behavior of DAC cells from different segments (scaled to the respective cell weights) that is observable at the DAC output can be called an inter-segment error. Whether the DAC performance will ultimately be limited by the inter-segment errors depends not only on their relative size compared to other errors, but also on the particular signal being processed.

Figure 3:
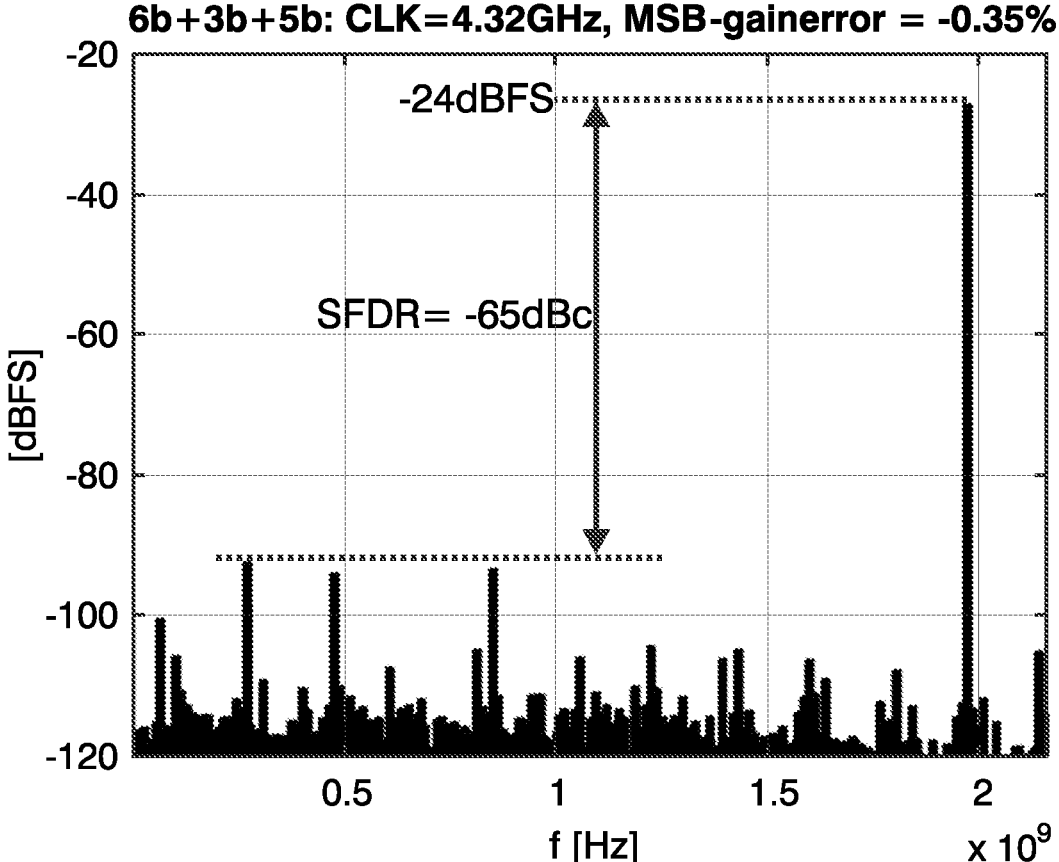
FIG. 3 shows spectrum of a single-tone signal with −0.35% most significant bit (MSB) gain error in deep back-off.

FIG. 3 shows spectrum of a single-tone signal with −0.35% MSB gain error in deep back-off. FIG. 3 shows a behavioral simulation example of a high-frequency $(0.91 \cdot f_{CLK}/2)$ single-tone signal in deep digital back-off (−24 decibels relative to full scale (dBFS)) for the DAC architecture of FIG. 2, with 14-bit overall resolution and segment resolutions, B1=5 bit, B2=3 bit, B3=6 bit, and a (static) gain error of −0.35% in the MSB segment as the only error. This means that the ideal gain factor $2^{B2+B3}$ in FIG. 2, which applies to each DAC cell in the MSB segment, is −0.35% smaller than its nominal value ($2^{5+3}=256$, since it is normalized to the LSB value), while everything else is assumed ideal. The MSB cell weight (equal for all cells in the MSB segment) in this example is therefore (1-0.0035)·256= 255.104.

Because only a few MSBs are excited in this example (5 out of 63), the mismatch between the MSB segment and the lower segments is felt much more severely than for a larger signal, in the sense that for such a small signal the error energy is much more correlated with the signal. Thus, it tends to concentrate in discrete tones and degrades the spurious-free dynamic range (SFDR) relative to the carrier, while for larger signals, the error energy is less correlated with the signal and tends to appear more noise-like.

Figure 4:
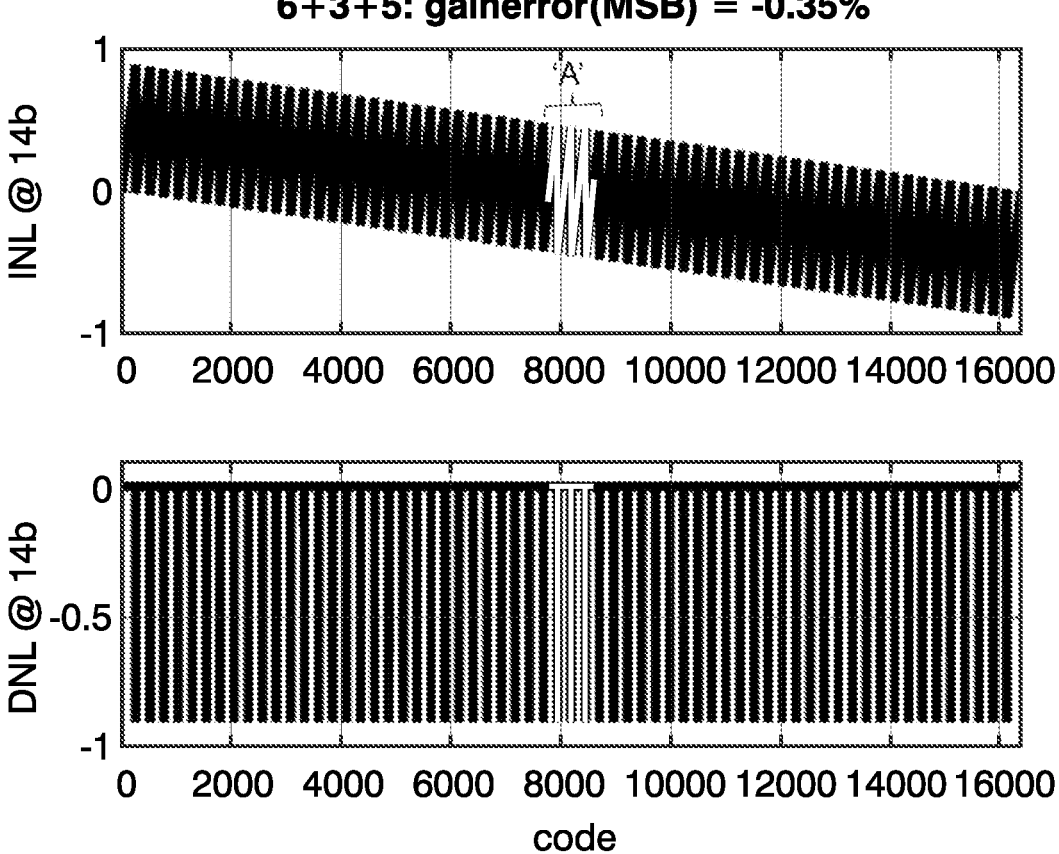
FIG. 4 shows static linearity characteristics of a 14-bit 3-segment DAC with −0.35% MSB gain error.

FIG. 4 shows static linearity characteristics of a 14-bit 3-segment DAC with −0.35% MSB gain error. The maximum differential non-linearity (DNL) is −0.9 LSB and the integral non-linearity (INL) is within −0.9 LSB to +0.9 LSB at the 14-bit level, which in practice would still count as a rather good result for a 14-bit converter. The portion of the static characteristic (indicated "A") is exercised when synthesizing the signal shown in FIG. 3. In case a better SFDR is desired for such a deeply backed-off signal, the segment mismatch should be reduced significantly, at least between the few MSB cells that are actually active and the lower DAC segments.

Figure 5:
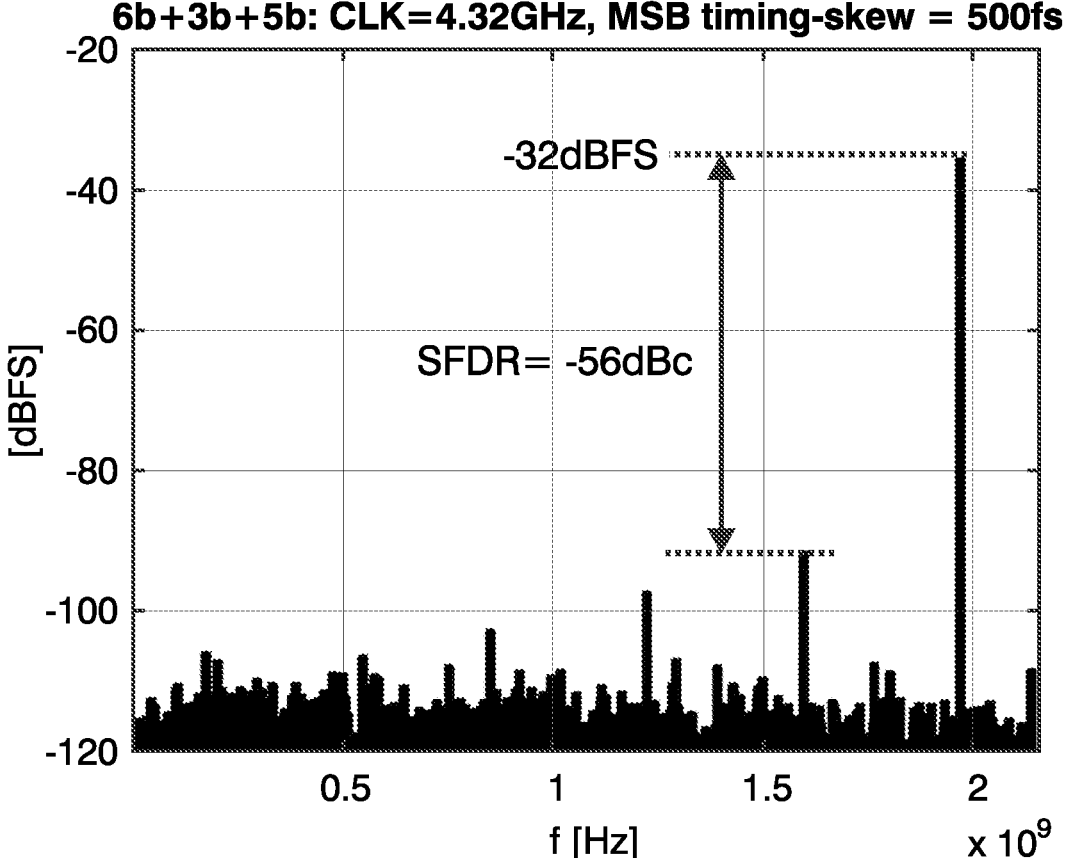
FIG. 5 shows another example of a small, synthesized sine wave subject to inter-segment error in a 3-segment DAC.

FIG. 5 shows another example of a small, synthesized sine wave subject to inter-segment error in a 3-segment DAC. The only error considered in this simulation is a systematic timing skew of +500 fs applied to all DAC cells in the uppermost segment. This means that each MSB cell is updated half a picosecond later than the DAC cells in the lower segments, while everything else is assumed ideal. The systematic 500 fs delay of the MSB-cells can be caused by a timing error in the retiming section, but it can also mean that there is a systematic 500 fs time delay in the summation network for each of the MSB-cells. The observable quantity is that, regardless of the origin of this systematic inter-segment timing mismatch, the output current from an MSB-cell shows up 500 fs later than the output current of DAC-cells from the other segments, leading to nonlinear distortion, because the error is signal dependent.

Dithering may be used to mitigate inter-segment error. Dither is an uncorrelated signal that is intentionally injected into an input of a system, such as a DAC or an analog-to-digital converter (ADC). Dithering in a DAC or an ADC is a process of adding a dither to the input signal to the DAC or ADC prior to the conversion. In subtractive dither systems, the dither added at the input is subtracted at the output of the system. In a subtractive dither system, a known (random, uncorrelated with the input signal) quantity is added to the input side of the converter and its effect is subtracted later in the processing chain, such that the dither does not show up (as additive noise) in the digital output signal of the ADC, or in the analog output signal of the DAC.

Dithering has been used to increase the SFDR in multi-stage ADCs, especially for small input signals. The main idea of dithering in an ADC is to randomize the error energy occurring in a multi-stage ADC when the individual ADC stages are not perfectly matched to each other, or, more generally, to randomize the effect of code transition errors that are strongly correlated with the input signal. If not subtracted, the application of dither generally improves the linearity (e.g., an SFDR) of the ADC at the expense of a modest increase in noise floor, assuming the randomized INL-errors are sufficiently small. In certain applications with sufficient oversampling, additive out-of-band dither can be added in both ADC and DAC, although in the case of a DAC this may pose additional restrictions on the anti-alias filtering. True Nyquist converters require subtractive dither, i.e., the dither signal is also subtracted at the output of the converter. This is easily realized in an ADC since the subtraction of the known dither signal is performed in the digital domain. On the other hand, subtractive dither in a DAC requires the accurate subtraction of the dither signal in the analog domain. This may be implemented by introducing redundancy, i.e., additional (overrange) DAC cells.

The segmented DACs with subtractive dither may be used in conjunction with any calibration or special switching arrangement (e.g., DEM) within the individual DAC segments. In other words, the dithering schemes may be transparent to the actual implementation of the DAC segments (sub-DACs), except for the existence of the overrange DAC. Any decoding and eventual special switching arrangement (for thermometer-coded segments) may happen after the digital dither is injected into the (binary) input data. Alternatively, all digital dither operations may also be performed after the decoding of the (binary) input data (in thermometer-coded segments).

In examples, instead of trying to measure and correct the inter-segment errors, subtractive dithering is employed to randomize the static and dynamic inter-segment errors. Cross-segment redundancy is introduced by adding an overrange DAC cell(s) in each of the lower segments included in the dithering operation. This redundancy is exploited by selecting different possible DAC cell combinations from different segments for certain allowed input codes, either randomly, or in a predefined way (e.g., following a formula or look-up table, etc.).

Figure 6:
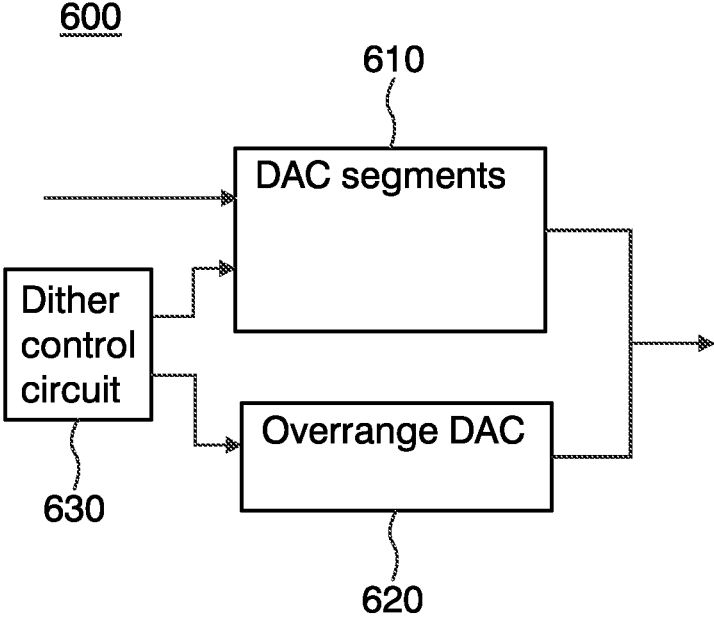
FIG. 6 is a schematic block diagram of a segmented DAC with subtractive dither in accordance with one example.

FIG. 6 is a schematic block diagram of a segmented DAC 600 with subtractive dither in accordance with one example. The segmented DAC 600 includes at least two DAC segments 610, at least one overrange DAC 620, and a dither control circuit 630. The number of DAC segments may be 2, 3, 4, or any positive integer number greater than one. Each DAC segment includes a plurality of DAC cells for generating an analog output signal based on input data to each DAC segment. Each DAC cell has a specific weight. Each segment may be binary-coded or thermometer-coded.

The overrange DAC 620 is configured to generate an analog output signal based on a control signal from the dither control circuit 630 for compensating the dither at the output of the segmented DAC 600 in an analog domain. The overrange DAC 620 may include one or more DAC cells.

The dither control circuit 630 is configured to add a dither (e.g., a random sequence) to the input data supplied to a higher-order DAC segment and modify the input data supplied to a lower-order DAC segment for compensating the dither. The dither is a signal that is intentionally injected into an input of the DAC 600. The dither may be uncorrelated to the (digital) input signal for better results, e.g., a pseudo-random sequence. The dither control circuit 630 generates the control signal for the overrange DAC 620 for compensating a remaining portion of the dither from an output of the segmented DAC 600 in an analog domain. The dither added to higher-order DAC segment is compensated by modifying the second input data supplied to a lower-order DAC segment and generating the control signal for the overrange DAC 620. An output of the overrange DAC 620 is combined with an output of the segmented DAC in an analog domain.

In some examples, the dither added to the input data may be restricted to a certain range. For example, the dither added to the input data to the higher-order DAC segment may be +1, 0, or −1, or alternatively either +1 or 0, or −1 or 0, (or in general the dither added to the input data to the higher-order DAC segment may be any integer in the range of +M to −M, or alternatively in the range of +M to 0, or −M to 0. In some examples, the portion of the dither subtracted from the input data to the lower-order DAC segment may be a half of the dither added to the input data to the higher-order DAC segment.

In some examples, in order to remove or reduce the correlation of the input data and the dither, the dither may be added to every predetermined number of input samples to the segmented DAC. In some examples, the higher-order DAC segment is thermometer-coded and the lower-order DAC segment is binary-coded.

The dither may be generated based on a random sequence, such as a pseudo-noise (PN) sequence. Alternatively, the random dither may be generated in different ways, which are tailored to the most likely signal statistics and digital back-off situation. Alternatively, the random dither may be dynamically changed while operating the DAC, since the transmit signal statistics or digital back-off is either known or could be extracted in baseband from the transmit data stream with appropriate additional digital intelligence.

With the segmented DAC with subtractive dither in accordance with examples disclosed herein the DAC linearity (e.g., the SFDR) can be improved, especially in deep digital back-off. The dithering scheme is stand-alone and completely transparent to the DAC operation. Therefore, it does not require any direct error measurement or calibration by itself. On the other hand, the dithering scheme can also be employed together with any digital intra-segment switching algorithm (e.g., DEM) and/or DAC calibration.

Figure 7:
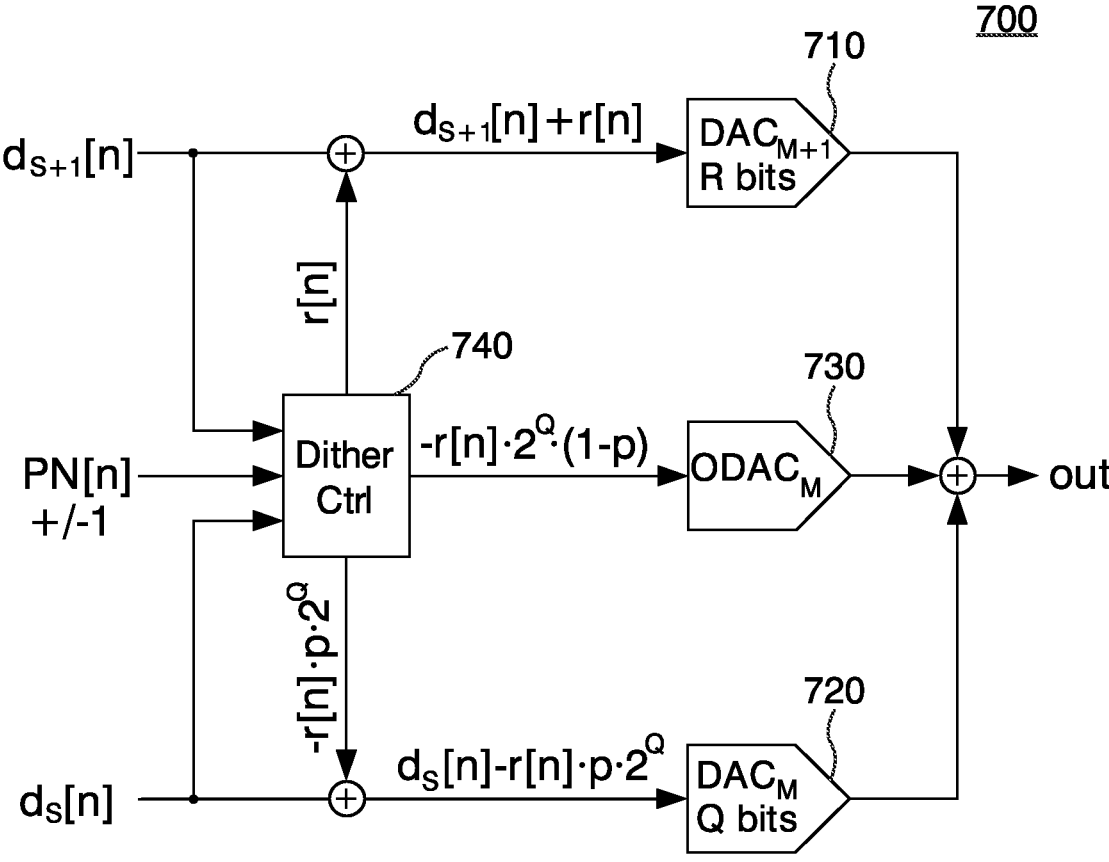
FIG. 7 shows an example 2-segment DAC with subtractive dither in accordance with one example.

FIG. 7 shows an example 2-segment DAC 700 with subtractive dither in accordance with one example. It should be noted that the structure of the segmented DAC 700 in FIG. 7 is merely an example, and the segmented DAC structure can be extended to more than two segments.

The segmented DAC 700 includes an upper segment 710 ($DAC_{M+1}$), a lower segment 720 ($DAC_M$), an overrange DAC 730 ($ODAC_M$), and a dither control circuit 740. Each of the lower segment 720 and the upper segment 710 includes a plurality of DAC cells with a specific weight. The overrange DAC 730 may include at least one DAC cell with a specific weight.

The upper segment 710 resolves R bits (higher-order bits) of the input sample n and the lower segment 720 resolves Q bits (lower-order bits) of the input sample n. Therefore, the smallest unit weight in the upper segment 710 is $2^Q$. For each input sample n, the digital dither control circuit 740 adds a dither r[n] (e.g., a random number) to the digital input data $d_{S+1}[n]$ of the upper segment 710, and at the same time subtracts a multiple p of the scaled dither, $r[n]\cdot p\cdot2^Q$, from the digital input data $d_S[n]$ of the lower segment 720, where p is a scale factor. A correction value of $r[n]\cdot2^Q\cdot(1-p)$ needs to be further subtracted to fully cancel the dither added in the digital domain in the upper segment 710. This correction value is generated by the overrange DAC 730 and subtracted from the analog output signal of the segmented DAC 700 in the analog domain. The overrange DAC 730 may be a part of the lower DAC segment 720 or may be separate from the lower DAC segment 720.

The dither r[n] may be generated based on a pseudo-random (PN) sequence. For example, the PN sequence may be generated with a linear feedback shift register (LFSR). The dither r[n] may be a positive integer value, zero, or a negative integer value. If the dither r[n] is zero, no change is made in the digital input data to the DAC segments. Because of the quantization of the lower DAC segment 720, the possible values for the scale factor p may be restricted to values $\{2^{-q}\}$ with q=[1, 2, . . . Q]. The number of levels in the overrange DAC 730 is equal to the number of levels in the dither r[n]. The number of output levels that the overrange DAC 730 can produce is equal to the number of levels in the dither r[n]. For example, with one overrange DAC cell in the overrange DAC 730, two output levels (i.e., a positive and a negative of the cell weight) can be produced by the overrange DAC 730.

Dither r[n] may be added if certain conditions are met for the input data. Dither r[n] may be added, if the input data in the upper segment 710 with resolution R and the input data in the lower segment 720 with resolution Q are within the respective valid range, respectively, after the dither is added. The conditions for injecting the dither r[n] are as follows:

$$0 \le d_{S+1}[n] + r[n] \le 2^R - 1, \text{ and} \qquad \text{Equation (1)}$$

$$0 \le d_S[n] - r[n]\cdot p\cdot2^Q \le 2^Q - 1, \qquad \text{Equation (2)}$$

where $d_S[n]$ is the input data to the lower segment and $d_{S+1}[n]$ is the input data to the upper segment, and p is the scale factor.

The dither control circuit 740 checks both Equations (1) and (2) to determine whether dither with a specific polarity and value can be added for a particular input sample n. A small scale factor p allows the addition of a dither value more often, since $d_S[n]-r[n]\cdot p\cdot2^Q$ will be more likely within the valid range of the lower segment 720 if p is small. However, it also makes the weight of the overrange DAC cells larger. In an extreme case of $p=2^{-Q}$, the dither is subtracted at the LSB-level of the lower segment 720. In this case, the overrange DAC 730 needs to assume the values $r[n]\cdot2^Q\cdot(1-2^{-Q})=r[n]\cdot(2^Q-1)$, i.e., equal to multiples of the entire full-scale value of the lower segment 720.

For a more efficient implementation of the segmented DAC in terms of circuit overhead, the dither r[n] and the scale factor p may be limited to a certain range or values. For example, the dither r[n]={−1, 0, +1} and the scale factor $p=2^{-1}=0.5$. More generally, the dither r[n] added to the input data to the higher-order DAC segment may be any integer in the range of +M to −M, or alternatively in the range of +M to 0, or −M to 0.

Figure 8:
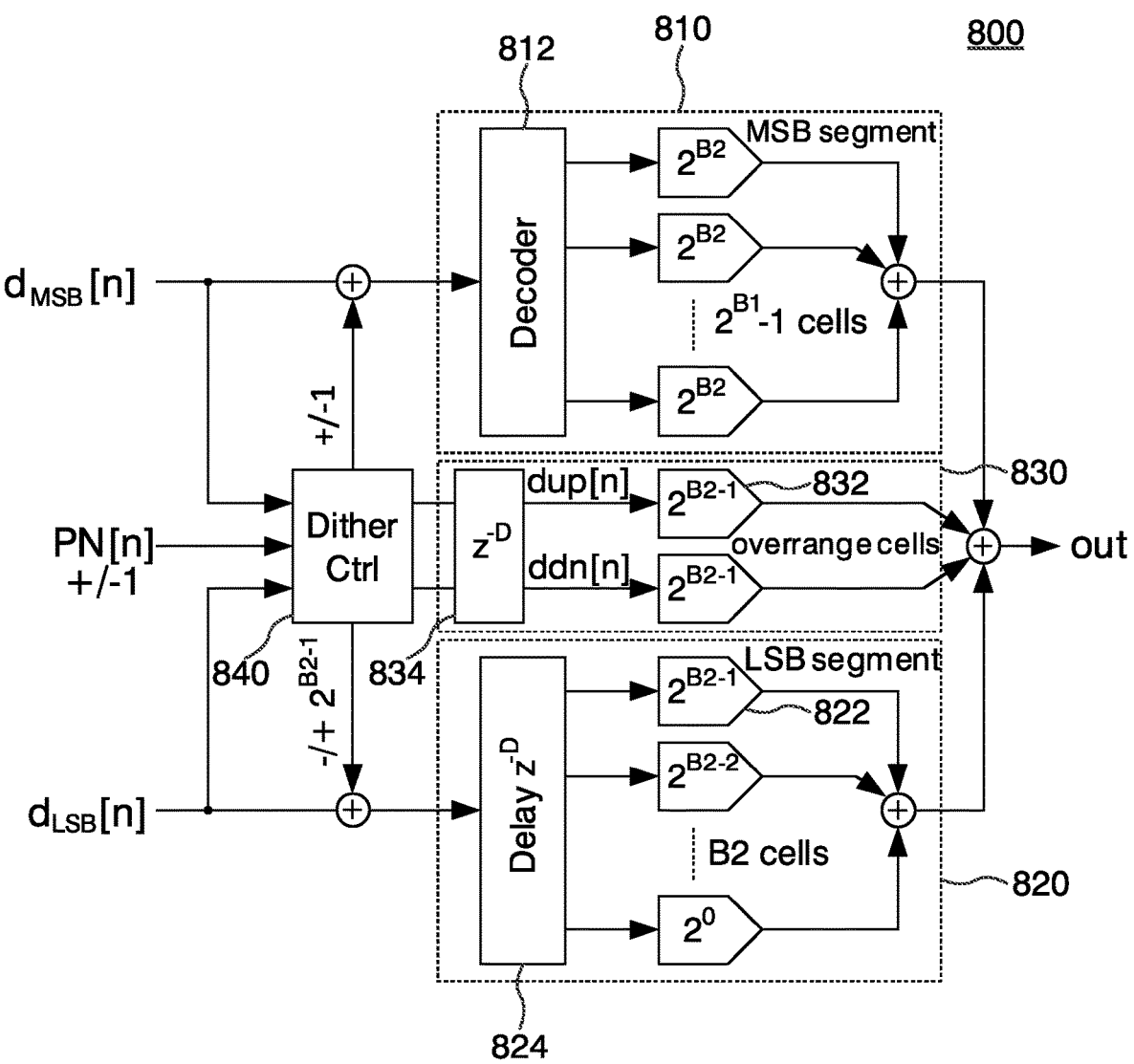
FIG. 8 shows an example 2-segment DAC with the dither r[n]={−1, 0, +1} and the scaling factor p=0.5, using two overrange DAC cells of value.

FIG. 8 shows an example 2-segment DAC with the dither r[n]={−1, 0, +1} and the scaling factor p=0.5, using two overrange DAC cells of value $2^{B2-1}$. The segmented DAC 800 includes an upper segment 810, a lower segment 820, an overrange DAC 830, and a dither control circuit 840. Each of the lower segment 820 and the upper segment 810 includes a plurality of DAC cells with a specific weight. The overrange DAC 830 includes two DAC cells 832. The upper segment 810 is an MSB segment receiving higher-order digits of the input sample n and the lower segment 820 is an LSB segment receiving lower-order digits of the input sample n. In this example, the lower segment 820 is binary-coded with a resolution of B2 bits. The lower segment 820 includes B2 binary-weighted DAC cells with binary-scaled weights of $2^0$ to $2^{B2-1}$. The upper segment 810 is thermometer-coded with a resolution of B1 bits. The upper segment 810 includes $2^{B1}-1$ equal-sized DAC cells with the same weight of $2^{B2}$. The outputs of the lower segment 820, the upper segment 810, and the overrange DAC 830 are combined as an output of the segmented DAC 800.

For each input sample n, the dither control circuit 840 adds a dither r[n] (−1, 0, or +1) to the digital input data $d_{MSB}[n]$ of the upper segment 810 in the digital domain, and at the same time subtracts a half of the dither value (i.e., $-2^{B2-1}$, 0, or $+2^{B2-1}$) from the digital input data $d_{LSB}[n]$ of the lower segment 820 in the digital domain. A correction value (i.e., the other half of the dither, i.e., $-2^{B2-1}$, 0, or $+2^{B2-1}$) is further subtracted by the overrange DAC 830 from the output of the segmented DAC 800 in the analog domain.

If the lower segment 820 is binary-coded, each of the overrange DAC cells 832 is a copy of the largest DAC cell 822 (i.e., the biggest binary-scaled DAC cell) in the lower segment 820. This can facilitate good matching between the overrange DAC cells 832 and the lower DAC segment 820. The digital operations required in the main (binary) data paths (i.e., performed before the digital decoder 812 (binary-to-thermometer decoding) in the upper segment 810) become very simple. More specifically, the addition of +1 or −1 in the upper segment data $d_{MSB}[n]$ and subtraction of $+/−2^{B2-1}$, (i.e., the half-scale), in the lower segment data $d_{LSB}[n]$ are simple. The latter can be a simple bit inversion of the highest bit in the binary word $d_{LSB}[n]$. Delay units 834, 824 (D clocks, which is the delay of the decoder in the MSB segment) may be included in the overrange DAC 830 and the lower segment 820 for synchronization of the output signals with the upper segment 810 at the output of the segmented DAC 800. Alternatively, the delay unit 834 may be implemented in the dither control circuit 840.

The dither control circuit 840 operates, for example, based on the momentary value of a binary PN sequence $PN[n]$, which may assume two values $\{0, 1\}$. In one example, the PN sequence may be generated with a maximum-length linear feedback shift register (LFSR). Alternatively, the random dither $r[n]$ may be generated in different ways, which are tailored to the most likely signal statistics and digital back-off situation. Alternatively, the random dither $r[n]$ may be dynamically changed while operating, since the transmit signal statistic/digital back-off is either known or could be extracted in baseband from the transmit data stream with appropriate additional digital intelligence.

The PN sequence introduces the necessary amount of randomness to decorrelate the dither from the input signal. If, during a particular sample n, the PN sequence assumes the target value that signals dither should be injected, the dither control circuit 840 checks whether the current input data to each DAC segment allows the addition of dither (i.e., whether Equations (1) and (2) above are satisfied). For example, if $PN[n]$ is not just binary values$+/−1$ but may be 3 levels $+1/0/−1$, in case of $PN[n]=0$ no action may be taken for additional randomness. If dither can be injected, the input data to both segments is changed and the input bits (control signal) to the overrange DAC cells are set appropriately. The input data value of $d_{LSB}[n]$ determines which polarity the dither can assume to keep the input data within the valid range (e.g., according to the Equations (1) and (2)). In the example shown in FIG. 8, one of the two polarities is always possible.

Since the injection/polarity of the dither is still conditional on the input data assuming a certain range of values, there is still a risk of unwanted correlation. Therefore, in some examples, the dither control circuit 840 may perform additional digital processing to remove any residual correlation between the dither and the input data. Even when all the conditions (e.g., Equations (1) and (2)) for injecting the dither are fulfilled, dither may be injected every other input sample, or in general every predetermined number of input samples. This may force an increased dither activity, because if dither is added in sample n, it will be removed during sample n+1 (in case of injecting dither every other input sample), irrespective of the input data and $PN[n]$ conditions. The optimum dither algorithm also depends on the signal statistic and the relative dynamic loading of the different segments.

Figure 9:
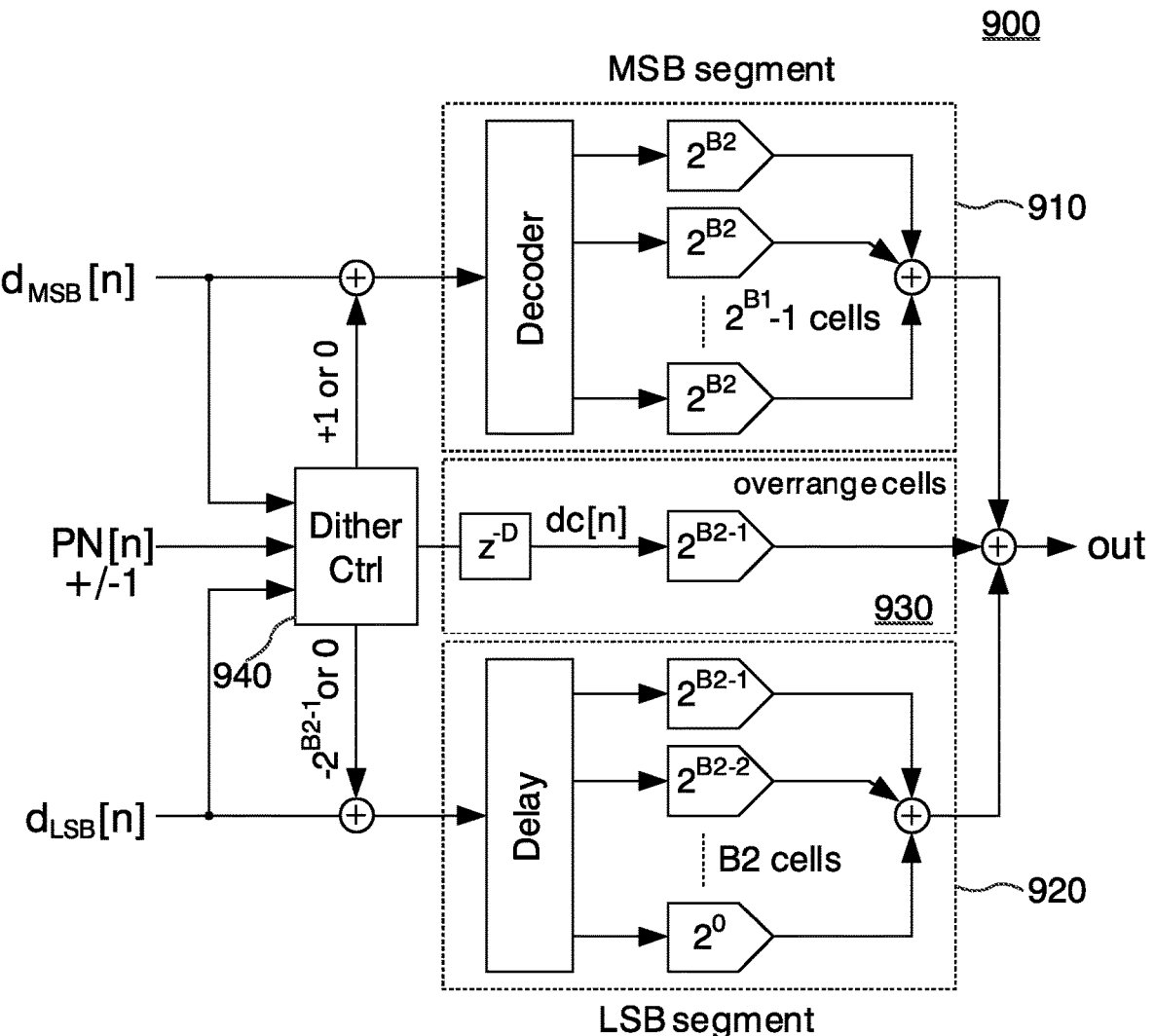
FIG. 9 shows an example 2-segment DAC with single polarity dither.

FIG. 9 shows an example 2-segment DAC 900 with single polarity dither with a dither $r[n]=\{0, +1\}$ and the scaling factor $p=0.5$, using a single overrange DAC cell of value $2^{B2-1}$. Alternatively, the dither may be $\{−1, 0\}$. An implementation is simpler with a single polarity dither.

The segmented DAC 900 includes an upper segment 910, a lower segment 920, an overrange DAC 930, and a dither control circuit 940. Each of the lower segment 920 and the upper segment 910 includes a plurality of DAC cells with a specific weight. The overrange DAC 930 includes a single DAC cell. The upper segment 910 is an MSB segment receiving higher-order digits of the input sample n and the lower segment 920 is an LSB segment receiving lower-order digits of the input sample n. In this example, the lower segment 920 is binary-coded with a resolution of B2 bits. The lower segment 920 includes B2 binary-weighted DAC cells with binary-scaled weights of $2^0$ to $2^{B2-1}$. The upper segment 910 is thermometer-coded with a resolution of B1 bits. The upper segment 910 includes $2^{B-1}−1$ equal-sized DAC cells with the same weight of $2^{B2}$. The outputs of the lower segment 920, the upper segment 910, and the overrange DAC 930 are combined as an output of the segmented DAC 900.

For each input sample n, the digital dither control circuit 940 adds a dither $r[n]$ of +1 or 0 to the digital input data $d_{MSB}[n]$ of the upper segment 910, and at the same time subtracts $2^{B2-1}$ or 0 from the digital input data $d_{LSB}[n]$ of the lower segment 920. A correction value of $2^{B2-1}$ is further subtracted by the overrange DAC 930 at the output of the segmented DAC 900 in the analog domain.

The dither control circuit 940 may perform the additional digital processing to remove any residual correlation between the dither and the input data. As an example, FIG. 10 shows an example algorithm for digital processing to remove any residual correlation between the dither and the input data in case of 2-segment DAC of FIG. 9. In this example, even when all the conditions (e.g., Equations (1) and (2)) for injecting the dither are fulfilled, dither may be injected every other input sample, or in general every predetermined number of input samples. In this example, a single-level dither is added in one polarity (e.g., +1 in the MSB segment is arbitrarily chosen), if the input data and the PN conditions (and any other added processing conditions inside the dither control) are fulfilled. Because one of these conditions are likely to remain unfulfilled (or can be forced to do so) from one input sample to the next, dither is still likely (or can be forced) to be added and then removed from one input sample to the next, in a random fashion due to the conditional query of the pseudo-random sequence $PN[n]$ in each input sample n.

The polarity of the dither may be configured differently. Instead of injecting $\{+1, 0\}$ into the upper segment 910, $\{−1, 0\}$ of dither may be injected into the upper segment 910 with corresponding sign change in the lower segment 920 and the overrange DAC cell 930.

The advantage of this example is not only that the dither control becomes somewhat simpler, but also the number of required overrange DAC cells is halved. A potential disadvantage of this simplified dither method is a systematic DC-offset at the output of the DAC, equal to the value of the overrange DAC cell, i.e., half the full-scale range of the lower segment. The polarity of the systematic DC-offset is equal to the chosen polarity of the upper segment dither. Inherently DC-free DACs, such as purely capacitive DACs, as well as DACs that are DC-capable but are ultimately AC-coupled at the output (e.g., current-steering DAC with on-chip resistive termination and transformer-based output matching network) will not experience any disadvantage.

The examples of FIGS. 8 and 9 can be extended to more than two segments in either order of cascading (top-down or bottom-up). The polarity of the dither is entirely arbitrary. Instead of injecting $\{+1, 0\}$ into the upper segment, $\{−1, 0\}$ of dither may be injected into the upper segment with corresponding sign change in the lower segment and the overrange DAC cell. The systematic DC-offset, if present, then changes its polarity. Example subtractive dithering scheme for a segmented DAC are disclosed in U.S. patent application Ser. No. 17/455,221 filed on Nov. 17, 2021, which is incorporated herein by reference as if fully set forth.

Digital segment mismatch correction can be used for inter-segment error correction. The idea of digital segment mismatch correction is to get a digital representation of the segment errors (amplitude and/or skew errors) by filtering the input data of DAC segments, segment-wise, and modify the input data to the DAC. By characterizing the segment errors and finding appropriate filter coefficients, the errors generated by the segments may be estimated in digital domain. A correction value is calculated and added to the DAC input data. This method relies on accurate characterization of the segment errors and may be limited to correction down to the DAC resolution, meaning values smaller than an LSB of the DAC may not be corrected.

Figure 11:
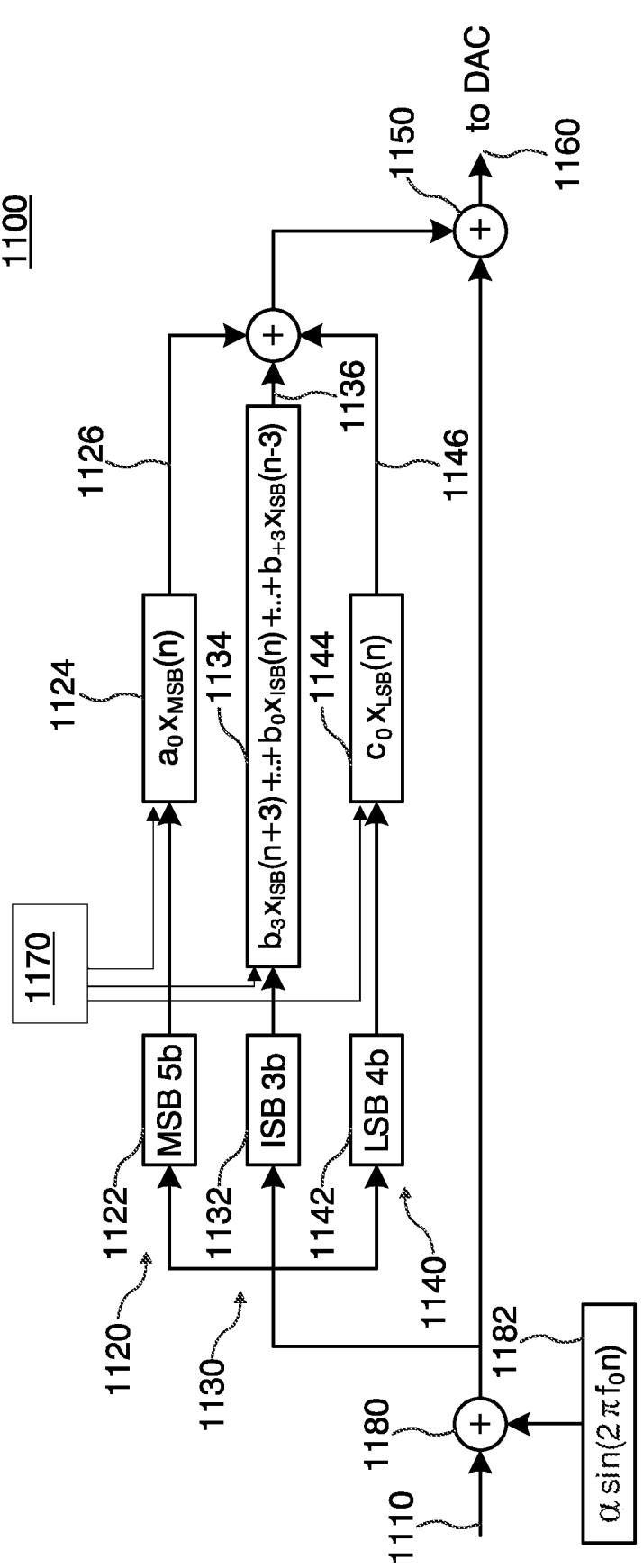
FIG. 11 shows an example system for digital mismatch correction between segments of a DAC.

FIG. 11 shows an example system 1100 for digital mismatch correction between segments of a DAC. In this example, the DAC (not illustrated in FIG. 11) includes three segments (a 5-bit MSB segment, a 3-bit ISB segment, and a 4-bit LSB segment as an example). Each segment of the DAC comprises one or more respective DAC cells which are activated based on a respective number of bits of a digital input word x(n) for the DAC. Each segment of the DAC generates a respective contribution to an analog output signal y(n) of the DAC. For example, the first segment generates a first contribution to the analog output signal y(n) based on a first number of bits of a digital input word x(n), the second segment generates a second contribution to the analog output signal y(n) based on a second number of bits of the digital input word x(n), and the third segment generates a third contribution to the analog output signal y(n) based on a third number of bits of the digital input word x(n). It should be noted that the DAC may comprise any number of segments, i.e., more or less than three segments. For example, the DAC may comprise two, four, five or more segments.

Each segment may have a slightly different gain and slightly different clock skew, as well as a slightly different delay to the analog output summing point of the DAC, leading to a gain and phase mismatch between the DAC segments. For example, if the DAC comprises three segments, the digital input word x(n) may be expressed as follows:

$$x(n) = MSB(x(n)) + ISB(x(n)) + LSB(x(n)), \qquad \text{Equation (3)}$$

where MSB(x(n)) denotes a number of most significant bits of the digital input word x(n), ISB(x(n)) denotes a number of intermediate significant bits of the digital input word x(n), and LSB(x(n)) denotes a number of least significant bits of the digital input word x(n).

In order to compensate the segment mismatch, the system 1100 comprises an input (node) 1110 configured to receive the digital input word x(n) as well as a respective processing circuit (line) 1120, 1130, and 1140 for the segments of the DAC (three segments in this example). The system 1100 comprises the first processing circuit 1120 for the first number of bits MSB(x(n)) controlling the first segment of the DAC, the second processing circuit 1130 for the second number of bits ISB(x(n)) controlling the second segment of the DAC, and the third processing circuit 1140 for the third number of bits LSB(x(n)) controlling the third segment of the DAC. The number of processing circuits may correspond to the number of segments of the DAC. For example, if the DAC comprises two segments, the system 1100 may include two processing circuits for the respective bits of the digital input word x(n) that control the two segments. If the DAC comprises four segments, the system 1100 may include four processing circuits for the respective bits of the digital input word x(n) that control the four segments, and the like. Different numbers of bits may control the individual segments of the DAC. In this example shown in FIG. 11, the first number of bits is five, the second number of bits is 3, and the third number of bits is 4, but the numbers can be any number.

The first processing circuit 1120 includes a first filter 1124 configured to modify (filter) the first number of bits MSB (x(n)) to generate first modified bits 1126. Similarly, the second processing circuit 1130 includes a second filter 1134 configured to modify (filter) the second number of bits ISB(x(n)) to generate second modified bits 1136. The third processing circuit 1140 comprises a third filter 1144 configured to modify (filter) the third number of bits LSB(x(n)) to generate third modified bits 1146. The first modified bits 1126, the second modified bits 1136, the third modified bits 1146, and the digital input word x(n) are combined by a combiner 1150 to generate a modified digital input word z(n) for the DAC. The system 1100 comprises an output (node) 1160 configured to output the modified digital input word z(n) to the DAC.

Filtering the input bits controlling the individual segments of the DAC may allow to compensate for the segment mismatch between the individual segments of the DAC. The compensation of the segment mismatch may enable an improved SFDR of the DAC. This will become clearer from the following example.

In the absence of any impairments, y(n)=x(n). If, for example, the delay introduced in the three segments is referenced to the first number of bits MSB (x(n)) and the delay of the third number of bits LSB(x(n)) is ignored (because their contribution to x(n) is comparatively small), a single linear filter may be used to model the amplitude and delay of the ISB segment, while a simple gain error can be used for the MSB and LSB segments.

Assuming that x(n) is, for example, an unsigned 12 bit signal, the analog output signal y(n) of the DAC may be modeled as an eleven term sum of products: one term for the first number of bits MSB(x(n)), seven terms for the second number of bits ISB (x(n)) and one term for the third number of bits LSB (x(n)). In terms of a mathematical expression, this may be expressed as follows:

$$
\begin{aligned}
y(n) = & \qquad\qquad\qquad\qquad\qquad \text{Equation (4)} \\
& (1 - a_0)MSB(x(n)) - b_{-3}ISB(x(n+3)) - b_{-2}ISB(x(n+2)) - \\
& b_{-1}ISB(x(n+1)) + (1 - b_0)ISB(x(n)) - b_{+1}ISB(x(n-1)) - \\
& \quad b_{+2}ISB(x(n-2)) - b_{+3}ISB(x(n-3)) + (1 - c_0)LSB(x(n)) \\
y(n) = & (1 - a_0)MSB(x(n)) - b_{-3}ISB(x(n+3)) - b_{-2}ISB(x(n+2)) - \\
& b_{-1}ISB(x(n+1)) + (1 - b_0)ISB(x(n)) - b_{+1}ISB(x(n-1)) - \\
& \quad b_{+2}ISB(x(n-2)) - b_{+3}ISB(x(n-3)) + (1 - c_0)LSB(x(n)).
\end{aligned}
$$

It should be noted that the above model is merely an example, not a limitation, and the analog output signal y(n) of the DAC may be modeled differently. The analog output signal y(n) of the DAC may be modelled for digital input words of other bit lengths and/or DACs comprising a different number of segments.

The error e(n) introduced by the segment mismatch may be expressed as follows:

$$e(n) = y(n) - y'(n) = \qquad\qquad\qquad \text{Equation (5)}$$

$$-(a_0 MSB(x(n)) + b_{-3} ISB(x(n+3)) + \ldots + b_0 ISB(x(n)) +$$

$$\ldots + b_{+3} ISB(x(n-3)) + c_0 LSB(x(n))),$$

$$e(n) =$$

$$y(n) - y'(n) = -(a_0 MSB(x(n)) + b_{-3} ISB(x(n+3)) + \ldots + b_0 ISB(x(n)) +$$

$$\ldots + b_{+3} ISB(x(n-3)) + c_0 LSB(x(n)))$$

where y'(n) denotes the ideal analog output signal of the DAC.

The compensation for the segment mismatch comprises subtracting the error e (n) from the digital input word x(n). In other words, the digital input word x(n) to the DAC is replaced by the modified digital input word z(n)=x(n)−e(n). The modified digital input word z(n) for the above example may be equivalently expressed as:

$$z(n) = x(n) + a_0 MSB(x(n)) + b_{-3} ISB(x(n+3)) + \ldots + \qquad \text{Equation (6)}$$

$$b_0 ISB(x(n)) + \ldots + b_{+3} ISB(x(n-3)) + c_0 LSB(x(n)).$$

$$z(n) = x(n) + a_0 MSB(x(n)) + b_{-3} ISB(x(n+3)) +$$

$$\ldots + b_0 ISB(x(n)) + \ldots + b_{+3} ISB(x(n-3)) + c_0 LSB(x(n)).$$

The individual coefficients of the above sum of products may be applied to the respective bits of the digital input word x(n) by the filters 1124, 1134, and 1144. It is to be noted that the above expressions may be determined for the digital input words of other bit lengths and/or DACs comprising different numbers of segments.

The first processing circuit 1120 includes a first extraction circuit 1122 configured to extract the first number of bits MSB(x(n)) from the digital input word x(n) and to supply the first number of bits MSB(x(n)) to the first filter 1124. Similarly, the second processing circuit 1130 includes a second extraction circuit 1132 configured to extract the second number of bits ISB(x(n)) from the digital input word x(n) and to supply the second number of bits ISB(x(n)) to the second filter 1134. The third processing circuit 1140 includes a third extraction circuit 1142 configured to extract the third number of bits LSB (x(n)) from the digital input word x(n) and provide the third number of bits LSB(x(n)) to the third filter 1144.

The filter coefficients for the filters 1124, 1134, and 1144 may be based on a measured error of the respective DAC segment. For example, the filter coefficients of the first filter 1124 may be based on a measured error of the first DAC segment. Similarly, the filter coefficients of the second filter 1134 may be based on a measured error of the second DAC segment. The filter coefficients of the third filter 1144 may be based on a measured error of the third DAC segment. For example, the error of the respective DAC segment may be measured using a least square estimation or any other algorithm as different linear response for each of the segments to account for amplitude and delay differences between the segments. By means of the adapted filter coefficients of the filters 1124, 1134, and 1144, the measured errors may be subtracted from the digital input word x(n) before it is fed to the DAC.

For adjusting the filter coefficients, the system 1100 may further include a filter adaptation circuit 1170 configured to determine the respective filter coefficients for one or more of the first filter 1124, the second filter 1134, or the third filter 1144 based on measured errors of the first segment, the second segment, and the third segment of the DAC (e.g., the errors may be derived from measured linear responses of the segments or other measured quantities).

The preventive subtraction of the error e(n) causes a small modification in the value of the digital input word x(n) such that a slightly different content for the individual DAC segments reaches the DAC input, which may cause spurs re-growth. Therefore, the compensation may be not fully effective. In order to reduce the residual spurs, the system 1100 may additionally include a second combiner circuit 1180 coupled between the input 1110 and each of the processing circuits (i.e., the first processing circuit 1120, the second processing circuit 1130, and the third processing circuit 1140 in the example of FIG. 11). The second combiner circuit 1180 is configured to modify the digital input word x(n) by combining the digital input word x(n) with a signal 1182 not related to the digital input word x(n). In other words, the signal 1182 may be an arbitrary signal that is not related to the input signal representing the digital input word x(n).

Adding the signal 1182 to the digital input word x(n) may allow to randomize the residual error in order to reduce the receptiveness of the residual segment mismatch error in the long term (spurs are thus spread in frequency and, hence, become a less damaging white noise).

An amplitude of the signal 1182 may be lower than a full scale of the DAC. For example, the amplitude of the signal is less than 5%, 1%, 0.5%, or 0.1% of the full scale of the DAC. The signal 1182 may, e.g., exhibit a frequency outside a frequency passband of the DAC. The frequency passband of the DAC is a range of frequencies that can pass through the DAC. The frequency of the signal 1182 may be below or above the frequency passband of the DAC (for example the frequency of the signal 1182 may be between 0 Hz and ½ of the DAC sampling frequency). For example, the frequency of the signal 1182 may be at least one decade below the frequency passband of the DAC. In some examples, the frequency of the signal 1182 may be in a stopband of the DAC. Therefore, in some examples, the signal 1182 may be a low amplitude and low frequency signal outside the band of interest of the DAC. The signal 1182 may, e.g., be a sinusoidal signal. In further examples, the frequency of the signal 1182 may be outside a frequency band of interest of an application using the DAC (e.g., outside a frequency band used for RF communication).

The above-described DAC segment mismatch correction method may be implemented fully digital such that no extra hardware in the analog domain is needed. The above-described DAC segment mismatch correction is flexible and programmable. It may allow to compensate any type of error, e.g., gain and skew. Further, the above-described DAC segment mismatch correction may be used with different degrees of granularity and may correct segment fractions or even individual DAC cells. In other words, the DAC segments may comprise one or more DAC cells, i.e., the DAC segments may be of arbitrary size. Example schemes for digital segment mismatch correction are disclosed in U.S. patent application Ser. No. 17/754,308 filed on Mar. 30, 2020, which is incorporated herein by reference as if fully set forth.

Digital correction of segment mismatch errors can obtain very good results in terms of spectral purity of a DAC output. However, it requires accurate measurement of the inter-segment errors. Furthermore, the DAC resolution will limit the accuracy of the correction if no further processing such as noise shaping is done on the DAC input signal. Increasing the DAC resolution for a more accurate inter-segment error cancellation is problematic, because this not only increases the area and power dissipation of the overall converter but adding further LSB cells with sufficient accuracy is increasingly impacted by the practical problems imposed by the scaling limit.

Dithering the DAC segment transitions can result in high spectral purity of the DAC output. However, if the segment errors are big, dithering alone will lead to degraded noise performance. In addition, if dithering is implemented just as additive dither on the DAC input data, the dither signal will show up at the DAC output which might be unwanted.

In examples disclosed herein, the methods of segment mismatch dithering using subtractive dither and digital segment mismatch correction are combined to improve the DAC performance beyond what is possible with the individual methods. The combination of both methods gets rid of the limitations of both. While the digital segment mismatch correction (DSMC) relies on accurate characterization of errors, the subtractive segment mismatch dithering (SSMD) does not require characterization at all. On the other hand, if the segment errors are big, the SSMD will show degraded noise performance as big errors are randomly spread in frequency domain, yielding potentially low signal-to-noise ratio (SNR). By applying the DSMC to an SSMD DAC, the segment errors can be minimized and randomized, yielding the best possible SFDR and signal-to-noise and distortion ratio (SNDR) performance.

Figure 12A:
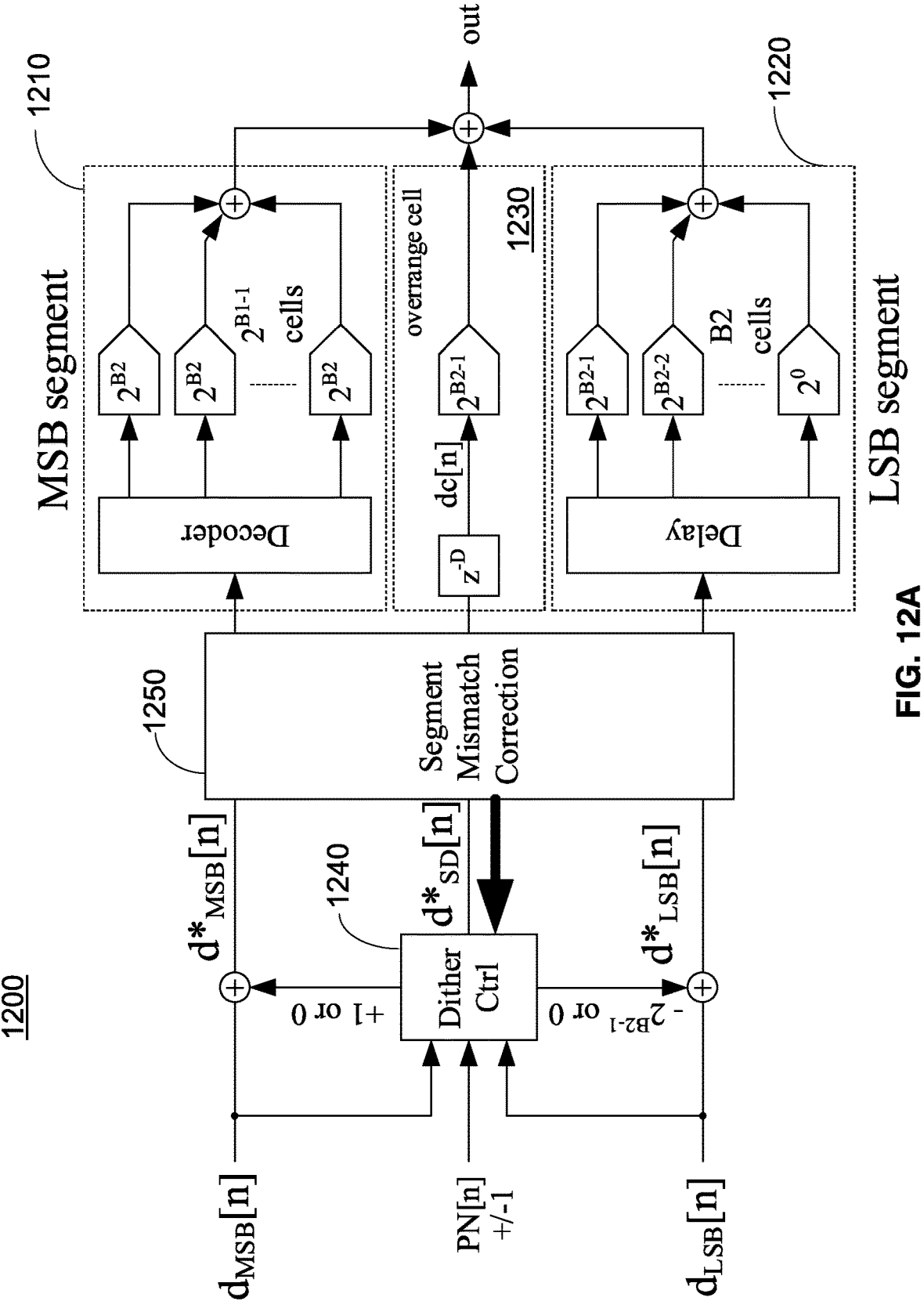
FIG. 12A shows a block diagram of an example implementation of combined segment mismatch correction and subtractive segment mismatch dithering.

FIG. 12A shows a block diagram of an example implementation of combined segment mismatch correction and subtractive segment mismatch dithering. Similar to the DAC 900 shown in FIG. 9, the example DAC 1200 in FIG. 12A is a 2-segment DAC with single polarity dither with a dither $r[n]=\{0, +1\}$ and the scaling factor $p=0.5$, using a single overrange DAC cell of value $2^{B2-1}$. Alternatively, the dither may be $\{-1, 0\}$. The segmented DAC 1200 includes an upper segment 1210, a lower segment 1220, an overrange DAC 1230, and a dither control circuit 1240. Each of the lower segment 1220 and the upper segment 1210 includes a plurality of DAC cells with a specific weight. The overrange DAC 1230 includes a single DAC cell (or alternatively more than one cell). The upper segment 1210 is an MSB segment receiving higher-order digits of the input sample n and the lower segment 1220 is an LSB segment receiving lower-order digits of the input sample n. In this example, the lower segment 1220 is binary-coded with a resolution of B2 bits. The lower segment 1220 includes B2 binary-weighted DAC cells with binary-scaled weights of $2^0$ to $2^{B2-1}$. The upper segment 1210 is thermometer-coded with a resolution of B1 bits. The upper segment 1210 includes $2^{B1}-1$ equal-sized DAC cells with the same weight of $2^{B2}$. The outputs of the lower segment 1220, the upper segment 1210, and the overrange DAC 1230 are combined as an output of the segmented DAC 1200.

For each input sample n, the digital dither control circuit 1240 may add a dither $r[n]$ of +1 or 0 to the digital input data $d_{MSB}[n]$ of the upper segment 1210, and at the same time subtracts $2^{B2-1}$ or 0 from the digital input data $d_{LSB}[n]$ of the lower segment 1220. A correction value of $2^{B2-1}$ is further subtracted by the overrange DAC 1230 at the output of the segmented DAC 1200 in the analog domain. The dither control circuit 1240 may perform additional digital processing to remove any residual correlation between the dither and the input data. The polarity of the dither may be configured differently. For example, instead of injecting $\{+1, 0\}$ into the upper segment 1210, $\{-1, 0\}$ of dither may be injected into the upper segment 1210 with corresponding sign change in the lower segment 1220 and the overrange DAC cell 1230.

The dither control circuit 1240 generates the input to the overrange DAC 1230 based on the DAC input data and a pseudorandom number. The input to the two DAC segments 1210, 1220 is modified depending on the dither control output in a way that the sum of the two segments plus the overrange DAC cell equals the wanted digital input code.

Figure 12B:
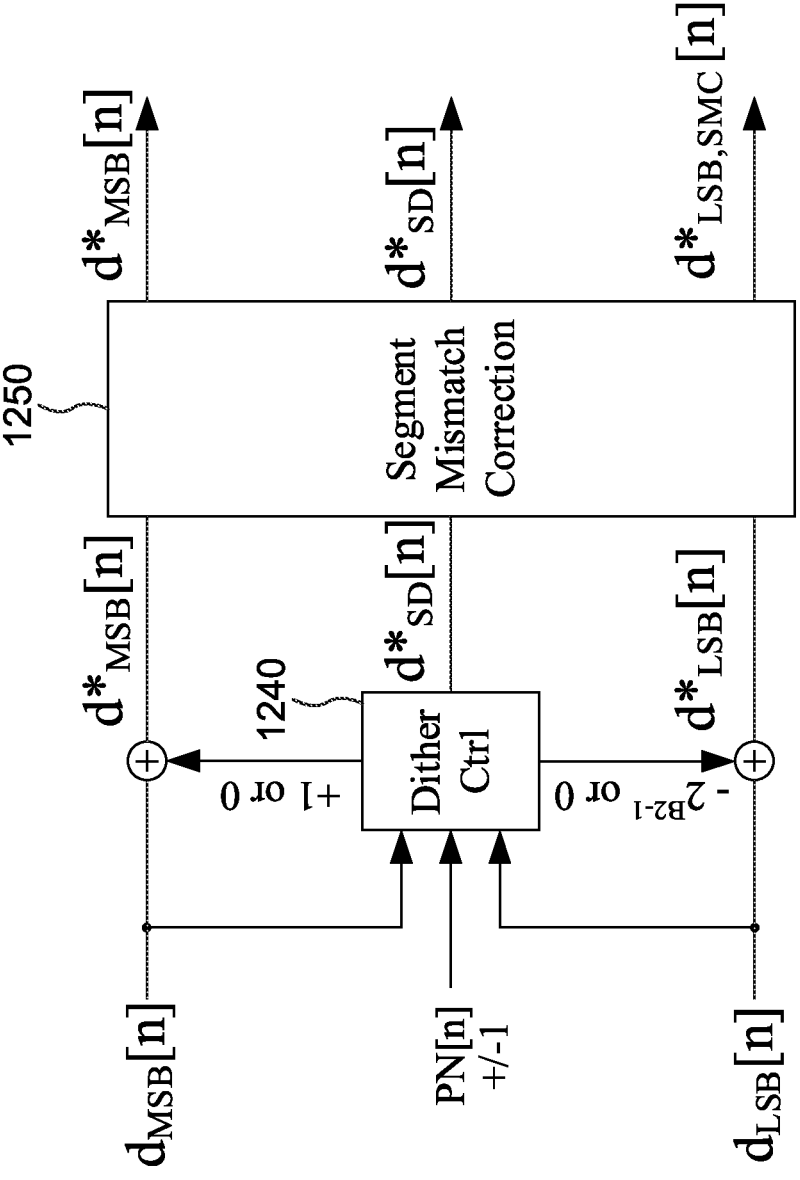
FIG. 12B shows generation of the modified input data for DAC segments and the overrange DAC.

FIG. 12B shows generation of the modified input data for DAC segments and the overrange DAC. The segment mismatch correction circuit 1250 receives the input data $d^*_{MSB}(n)$, $d^*_{LSB}(n)$, and $d^*_{SD}(n)$ for the MSB and LSB segments and the overrange DAC after being modified by the dither. The segment mismatch correction circuit 1250 may further modify the input data to generate further modified data $d^*_{MSB}(n)$, $d^*_{LSB,SMC}(n)$, and $d^*_{SD}(n)$ for segment mismatch correction. In this example, the segment mismatch correction circuit 1250 applies the correction only to the LSB input data. Alternatively, the segment mismatch correction circuit 1250 may apply the correction to other segment input data as well, such the MSB segment input data (and/or the ISB segment input data if any).

The example of FIGS. 12A and 12B can be extended to more than two segments in either order of cascading (top-down or bottom-up) and may also be extended to a DAC using two (or more) overrange DAC cells as shown in FIG. 8. The polarity of the dither is entirely arbitrary. Instead of injecting $\{+1, 0\}$ into the upper segment, $\{-1, 0\}$ of dither may be injected into the upper segment with corresponding sign change in the lower segment and the overrange DAC cell. The systematic DC-offset, if present, then changes its polarity.

Given the necessary dimensioning of the overrange DAC 1230 and the lower segment 1220 (LSB segment) to achieve the correct cell weight, both the overrange DAC 1230 and the lower segment 1220 would have a mismatch compared to the upper segment 1210 (MSB segment). In examples, the DAC 1200 includes a digital segment mismatch correction (DSMC) circuitry 1250 upfront of the DAC. The DSMC circuitry 1250 may be configured to calculate the errors of the upper segment 1210, the lower segment 1220, and the overrange DAC 1230 (or alternatively the lower segment 1220, and the overrange DAC 1230) and modify the input code to the DAC (or alternatively the input code to the lower segment, or input code to any segment or all segments) such that the error is cancelled or minimized as described above.

The DSMC circuitry 1250 may yield a result that cannot be represented by the physical DAC. For example, the overrange DAC cell may be active and the errors calculated by the DSMC circuitry 1250 may be in a way that the applied code to the DAC would have to be below the minimum input code. In some examples, the DSMC circuitry 1250 may feed this information back to the dither control circuit 1240 to modify the overrange DAC input, (e.g., switch off the overrange DAC cell 1230). The data flow may be one direction only or, as in this example, bi-directional between the dither control circuit 1240 and the DSMC circuitry 1250.

In the example shown in FIGS. 12A and 12B, the dither $r[n]$ is added to the digital input data $d_{MSB}[n]$ of the upper segment 1210, and a portion of it (e.g., a half) is subtracted from the digital input data $d_{LSB}[n]$ of the lower segment 1220, and a remaining portion of it (e.g., the other half) is further subtracted by the overrange DAC 1230 at the output of the segmented DAC 1200 in the analog domain. Alternatively, the dither may be added to the digital input data of the segmented DAC and the same amount may be subtracted by the overrange DAC in the analog domain as shown in FIGS. 13-15.

Figure 13:
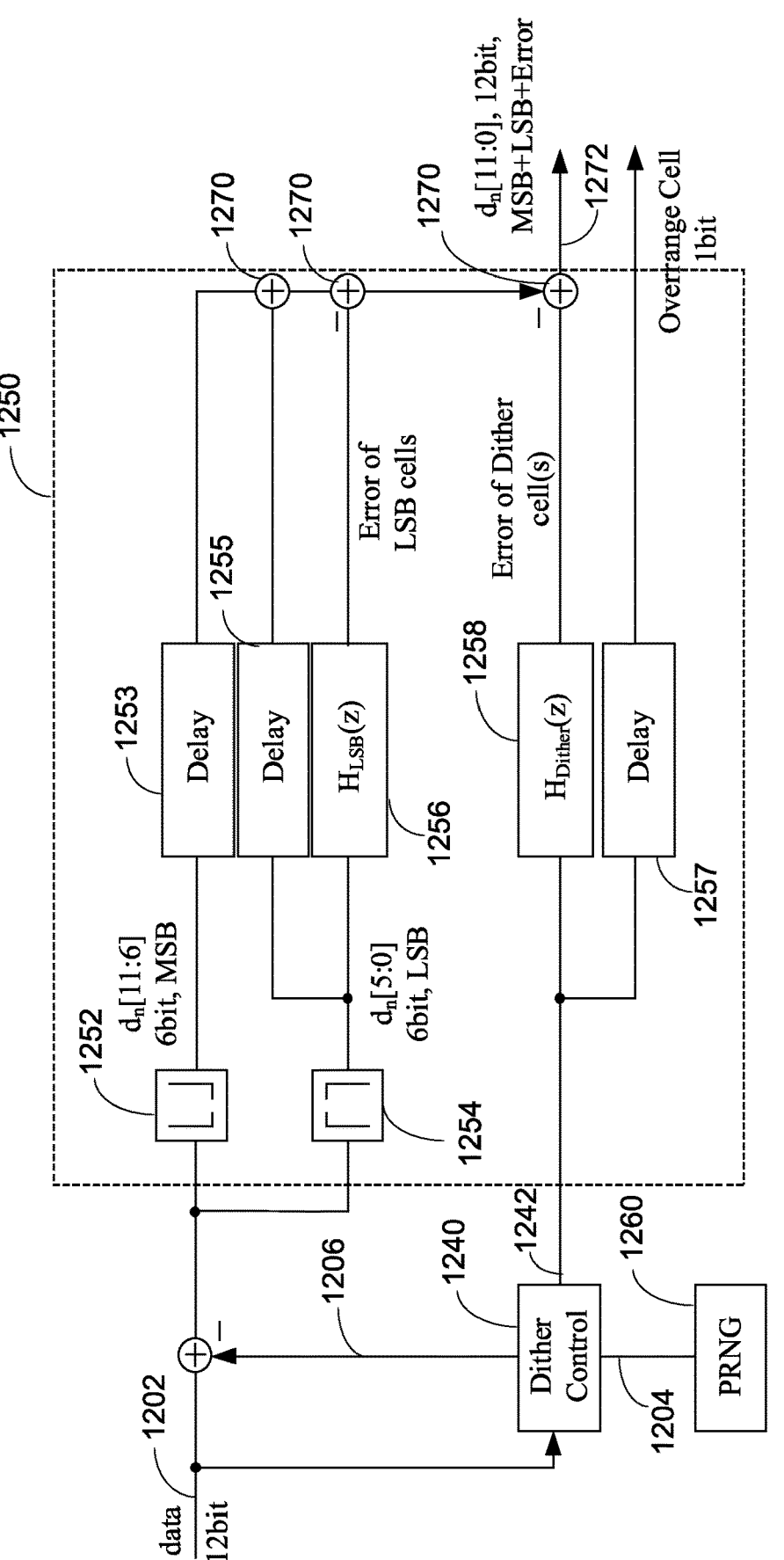
FIG. 13 shows an example implementation of the digital segment mismatch correction (DSMC) circuitry for the two-segment DAC.

FIG. 13 shows an example implementation of the DSMC circuitry for the two-segment DAC. The dither control circuit 1240 receives the DAC input data 1202 (e.g., 12 bits in this example) and generates a dither 1206 and an overrange DAC control data 1242 (e.g., one bit or alternatively more than one bit) to be sent to the overrange DAC 1230 based on the DAC input data 1202 and a pseudorandom number 1204 generated by a pseudorandom number generator (PRNG) 1260. The DSMC circuitry 1250 receives the DAC input data 1202 after being modified by the dither 1206 and the overrange DAC control bit 1242. Alternatively, as shown in FIGS. 12A and 12B, the dither may be added to the MSB data and a portion of the dither may be subtracted from the LSB data, and the remaining portion may be subtracted by the overrange DAC control bit. The DSMC circuitry 1250 calculates the errors of the lower segment 1220 and the overrange DAC 1230 and modifies the DAC input data (or DAC segment input data) to cancel or minimize the errors. In this example, only the errors of the LSB segment and the dither cells are determined and the LSB segment error and overrange DAC error are corrected/subtracted. Alternatively, the errors of the upper segment 1210 may also be determined and corrected, or only the LSB segment error or the LSB segment error and the upper segment error may be corrected. The correction of the mismatch error may be limited to the segments of the main DAC and the mismatch error of the overrange DAC may or may not be corrected. The example in FIG. 13 shows processing the input data for the LSB segment and the overrange DAC as an example, not as a limitation, and the DSMC circuitry 1250 may correct one or more of the segments and/or the overrange DAC (i.e., the input data for any one or more segments and/or the overrange DAC may be processed by one or more filters and combined with the DAC input data or DAC segment input data).

The DSMC circuitry 1250 includes circuitry 1252, 1254 to determine the input data to the MSB segment and the input data to the LSB segment, respectively, (6 bits each in this example) from the DAC input data 1202. For example, the circuitry 1252 may implement a floor function to determine the MSB input data to the MSB segment from the segmented DAC input data 1202 and supply the MSB input data to the delay unit 1253, and the circuitry 1254 may implement a ceiling function to determine the LSB input data to the LSB segment from the segmented DAC input data 1202 and supply the LSB input data to the filter 1256 and the delay unit 1255.

The DSMC circuitry 1250 may be configured to calculate the errors of the lower segment 1220 and the overrange DAC 1230 (in general, the error of any segment(s) and/or the overrange DAC) relative to the upper segment 1210. In one example, the DSMC circuitry 1250 includes a filter 1256 for processing the LSB input data and a filter 1258 for processing the overrange cell control bit (optional). The filter 1256 processes the LSB input data and the filter 1258 processes the overrange cell control bit using the respective filter coefficients. As explained above, the filter coefficients for the filters 1256, 1258 may be based on a measured error of the respective DAC segment. For example, the filter coefficients of the filter 1256 may be based on a measured error of the LSB DAC segment, and the filter coefficients of the filter

1258 may be based on a measured error of the overrange DAC segment. Alternatively, the DSMC circuitry 1250 may include an additional filter for processing the MSB input data. The filters 1256, 1258 may be any linear or non-linear digital filter.

The DSMC circuitry 1250 modifies the input data 1202 or the input data to the DAC segments such that the error is cancelled or minimized as described above. The MSB input data and the LSB input data are delayed by delay units 1253, 1255, respectively and combined with the outputs of the filters 1256 and 1258 by combiner circuitry 1270 to generate a modified DAC input data 1272. The modified DAC input data 1272 and the overrange cell control bit 1242 (after being delayed by a delay unit 1257) are sent to the DAC and the overrange DAC 1230. In this example, the mismatch errors of the LSB segment and the overrange DAC (i.e., dither cell(s)) are corrected in the digital input of the DAC.

Figure 14A:
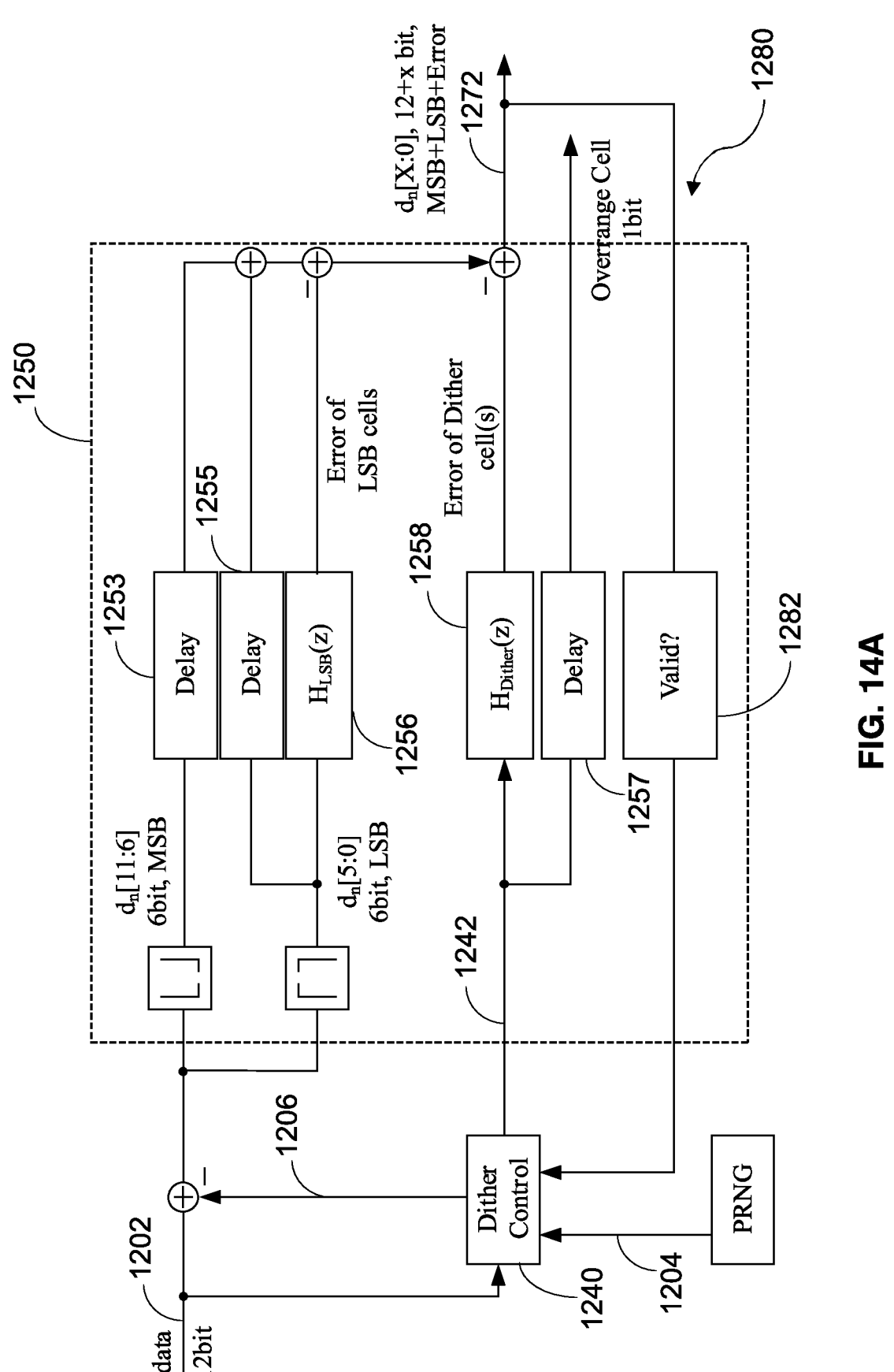
FIG. 14A shows another example implementation of the DSMC circuitry for an example two-segment DAC.
Figure 15:
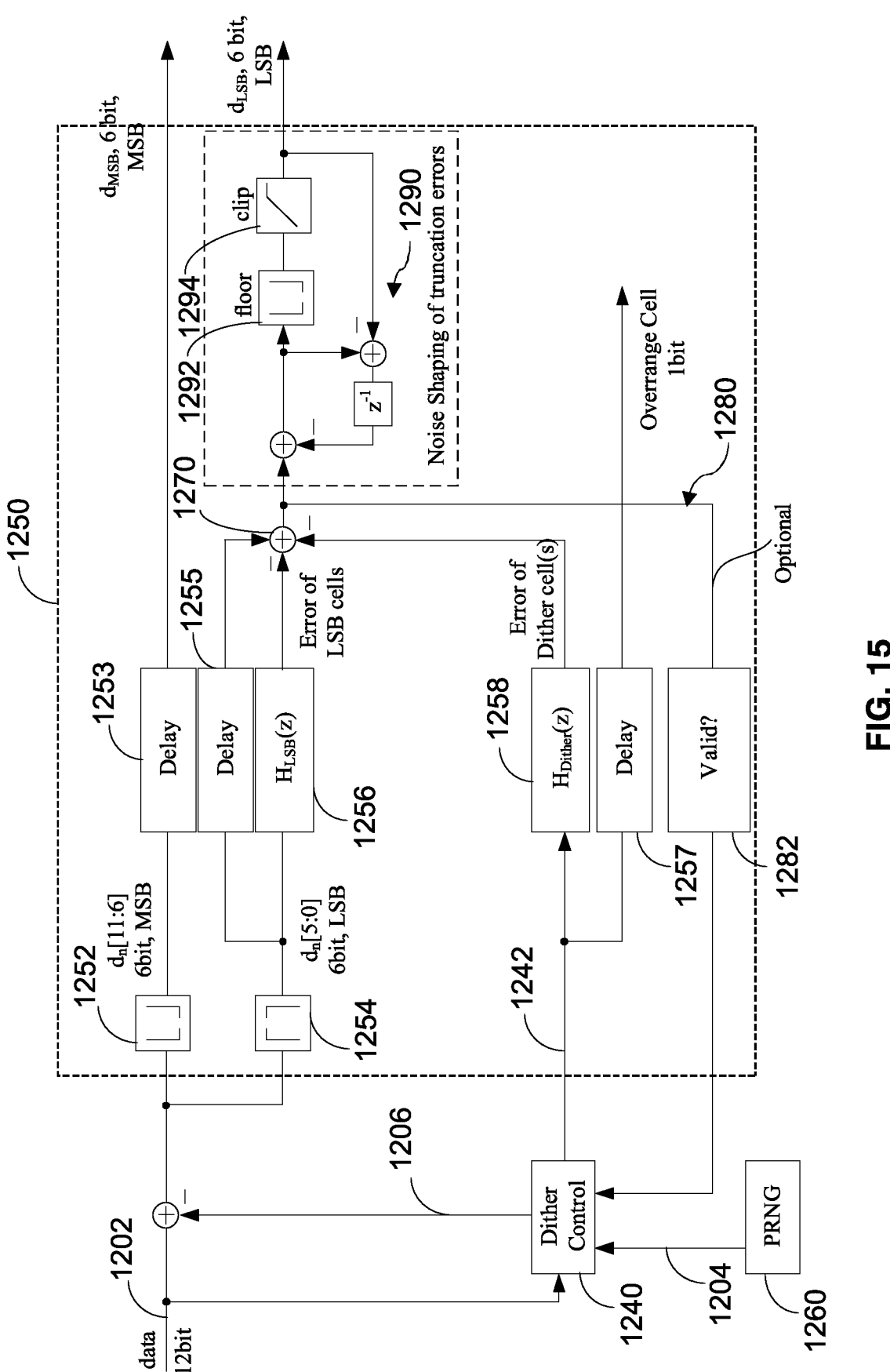
FIG. 15 shows another example implementation of the DSMC circuitry for an example two-segment DAC.

FIG. 14A shows another example implementation of the DSMC circuitry for an example two-segment DAC. The structure of the DAC shown in FIG. 14A is basically same as the structure of the DAC shown in FIG. 13. Therefore, the same components will not be explained again for simplicity. In this example, the dithering sequence may be altered depending on the DSMC output. The DAC may include a feedback path 1280 from the output of the DSMC circuitry 1250 to the dither control circuit 1240.

The feedback path 1280 includes validity determination circuit 1282 that is configured to determine the validity of the modified DAC input data 1272. The validity determination circuit 1282 sends a control signal to the dither control circuit 1240 based on the validity determination on the modified DAC input data 1272. For example, if the validity determination circuitry 1282 determines that the modified DAC input data 1272 is not in a valid range for the DAC or any dither modification is necessary, the validity determination circuitry 1282 sends a control signal to the dither control circuit 1240. The dither control circuit 1240 may then modify the dithering (e.g., turning off dithering, changing the polarity or value of the dither, etc.).

Figure 14B:
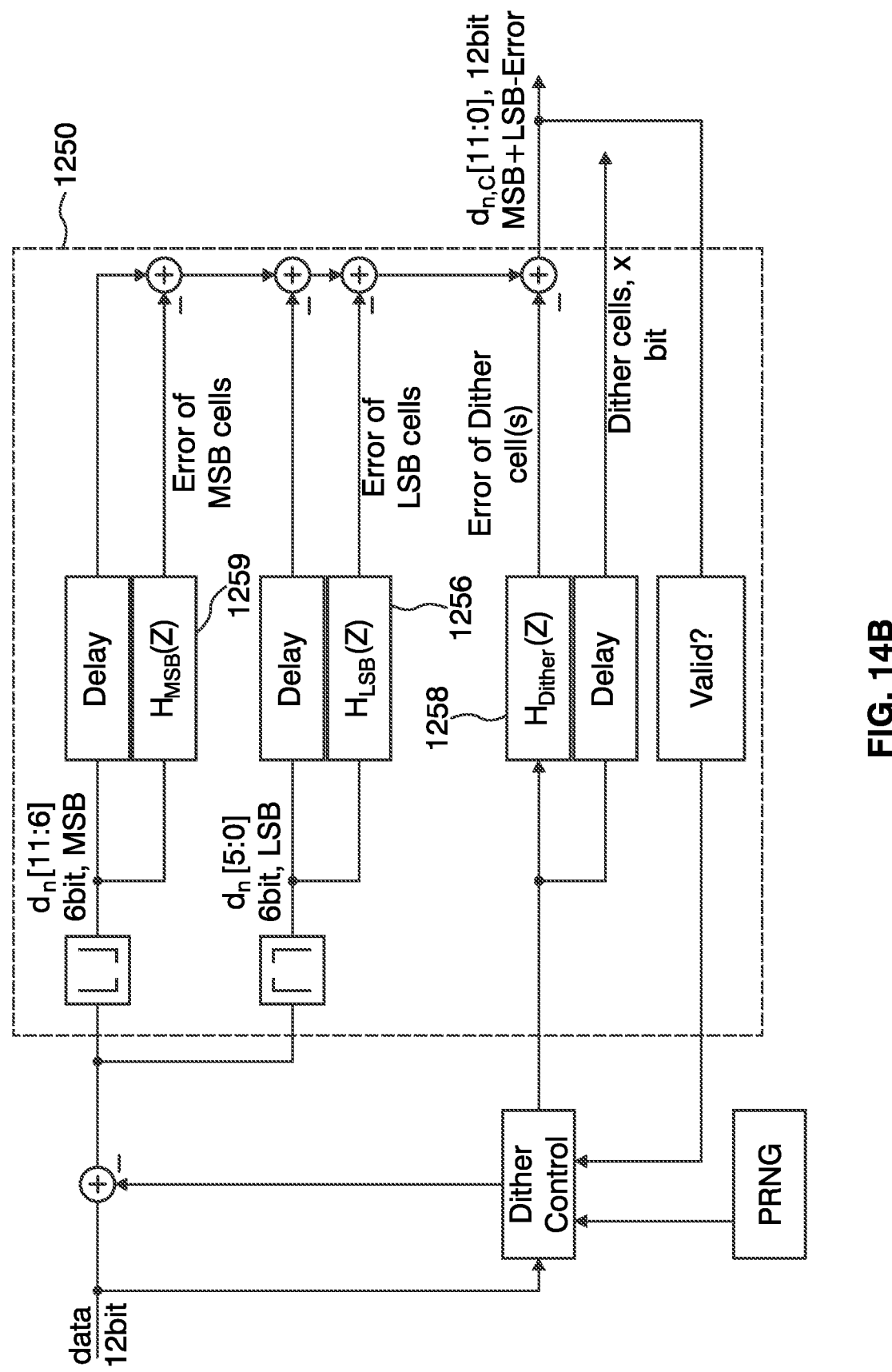
FIG. 14B shows another example implementation of the DSMC circuitry for an example two-segment DAC.

FIG. 14B shows another example implementation of the DSMC circuitry for an example two-segment DAC. The structure of the DAC shown in FIG. 14A is basically same as the structure of the DAC shown in FIG. 14A. Therefore, the same components will not be explained again for simplicity. In FIG. 14B, the segment mismatch correction circuit 1250 includes a filter 1259 for processing the MSB input data. The MSB segment error is also determined by the filter 1259 and combined with the outputs of other filters 1256, 1258 (or only with the output of the filter 1256) and the MSB and LSB segment input data to generate the modified input data for the segmented DAC. In general, any one or more of the outputs of the filters 1256, 1258, and 1259 may be combined with the input data for the LSB segment and/or the MSB segment.

FIG. 15 shows another example implementation of the DSMC circuitry for an example two-segment DAC. In this example, the correction of errors calculated in the DMSC circuitry 1250 may be applied only to the LSB segment. In case of three-segment DAC, the correction may be applied to the LSB and ISB segments or only to the LSB segment. The dither control circuit 1240 receives the DAC input data 1202 (e.g., 12 bits in this example) and generates a dither 1206 and an overrange DAC control data 1242 (e.g., one bit or alternatively more than one bit) to be sent to the overrange DAC 1230 based on the DAC input data 1202 and a pseudorandom number 1204 generated by a pseudorandom number generator 1260. The DSMC circuitry 1250 receives the DAC input data 1202 after being modified by the dither 1206 and the overrange DAC control data 1242, calculates the errors of the lower segment 1220 and the overrange DAC 1230, (in general, the error of any one or more segments and/or the overrange DAC), and modifies the input data to the lower segment to cancel or minimize the errors.

The DSMC circuitry 1250 includes circuit 1252, 1254 to determine the MSB input data to the MSB segment and the LSB input data to the LSB segment, respectively, (6 bits each in this example) from the DAC input data 1202. For example, the circuit 1252 may implement a floor function to determine the MSB input data and supply the MSB input data to the delay unit 1253, and the circuit 1254 may implement a ceiling function to determine the LSB input data and supply the LSB input data to the filter 1256 and the delay unit 1255. The DSMC circuitry 1250 is configured to calculate the errors of the lower segment 1220 and the overrange DAC 1230, (in general, the error of any one or more segments and/or the overrange DAC). The DSMC circuitry 1250 includes a filter 1256 for processing the LSB input data and a filter 1258 for processing the overrange DAC cell input data. The filter 1256 processes the LSB input data and the filter 1258 processes the overrange DAC cell input data using the respective filter coefficients as explained above.

In this example, the DSMC circuitry 1250 modifies the input data to the LSB segment. The MSB input data is delayed by a delay unit 1253 and sent to the MSB segment. The LSB input data is delayed by a delay unit 1255 and combined with the outputs of the filters 1256 and/or 1258 by combiner circuitry 1270 and then sent to the LSB segment. The overrange DAC cell input data 1242 is delayed by a delay unit 1257 and then sent to the overrange DAC 1230. Limiting the correction to be applied to only the LSB segment can prevent triggering a new segment transition due to segment mismatch correction being applied, resulting in a wrong correction value.

In this example, the DAC may further include a feedback path 1290 for noise shaping of truncation errors of the LSB segment input data for enhanced resolution of the DSMC operation. The modified LSB input data after combined with the errors of the LSB segment and the dither cell (overrange DAC cell) is processed by circuit 1292 implementing a floor function and truncated to the configured length for the LSB segment (6 bits in this example) by a clipper 1294. The truncation error (i.e., the difference before and after the processing by the circuit 1292 and clipper 1294) is delayed and subtracted from the subsequent modified LSB input data (or alternatively the LSB input data before combining with the outputs of the filters 1256 and 1258). A feedback path 1280 to the dither control circuit 1240 may optionally be included, altering the dithering control depending on the output of the DSMC as explained above.

Figure 16A:
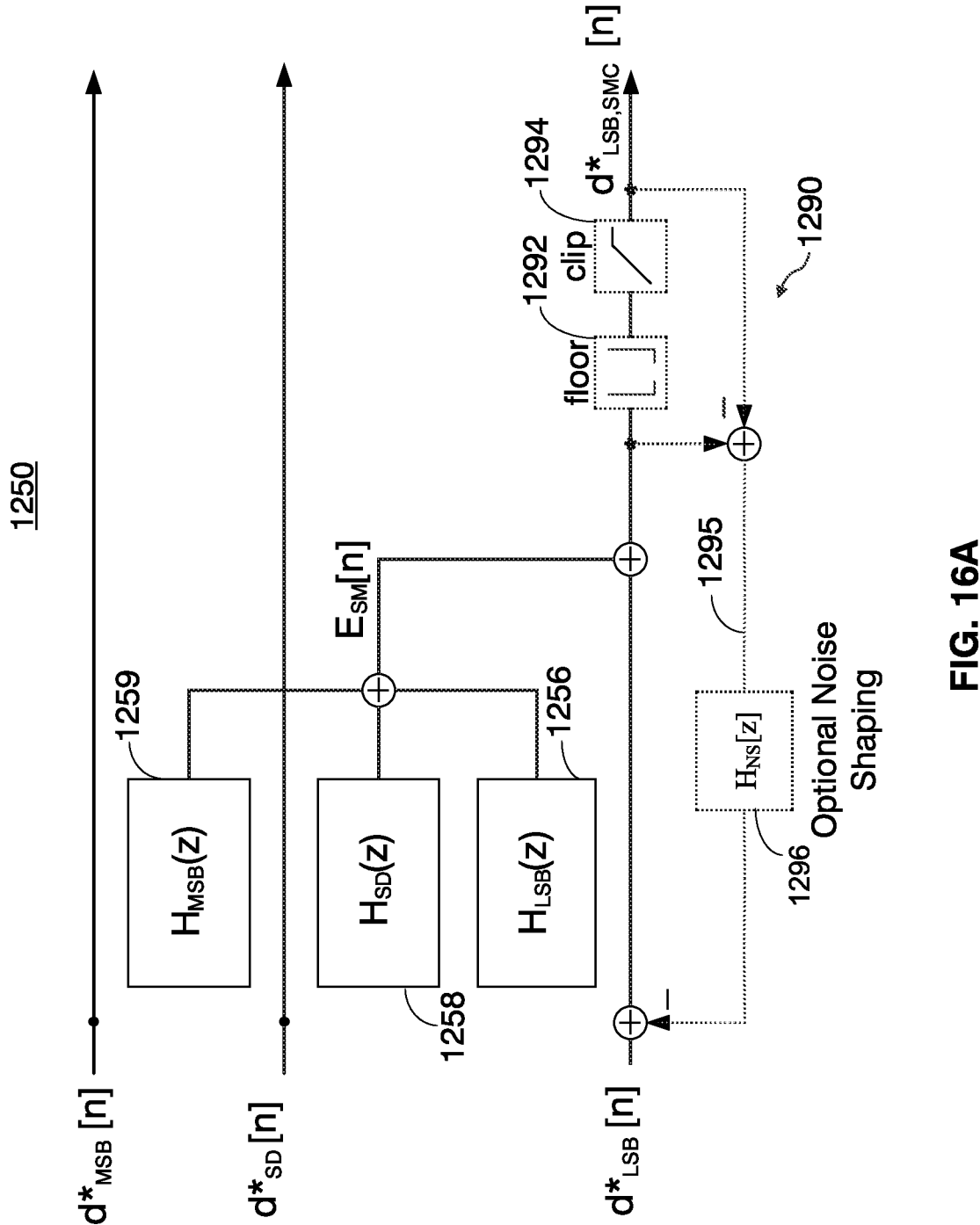
FIG. 16A shows a block diagram of another example DSMC for a DAC.

FIG. 16A shows a block diagram of another example DSMC for a DAC. In this example, the DSMC circuitry 1250 includes digital filters for calculation of segment errors for the MSB segment, the LSB segment, and/or the dither segment (i.e., the overrange DAC) as well as the optional noise shaping path for truncation errors on the modified LSB input data. In this example, the DSMC circuitry 1250 is configured to calculate the errors of the upper segment 1210, the lower segment 1220, and the overrange DAC 1230. Alternatively, the DSMC circuitry 1250 may calculate the errors of any one or more of the upper segment 1210 and the lower segment 1220 and/or the dither segment. The DSMC circuitry 1250 may include a filter 1259 for processing the MSB input data, a filter 1256 for processing the LSB input data, a filter 1258 for processing the overrange DAC cell input data. The filters 1256, 1258, 1259 process the MSB input data, the LSB input data, and the overrange DAC cell input data, respectively, using the respective filter coefficients. The filter coefficients of the filters 1256, 1258, 1259 may be determined based on a measured error of the MSB segment, the LSB segment, and the overrange DAC segment, respectively. The DSMC 1250 may optionally include a feedback path 1290 for noise shaping of the truncation errors on the LSB input data as shown in FIG. 15. In this example, the truncation error 1295 may be further processed by a filter 1296 (noise shaping filter) before being subtracted from the subsequent LSB input data (or alternatively from the subsequent modified LSB input data).

Figure 16B:
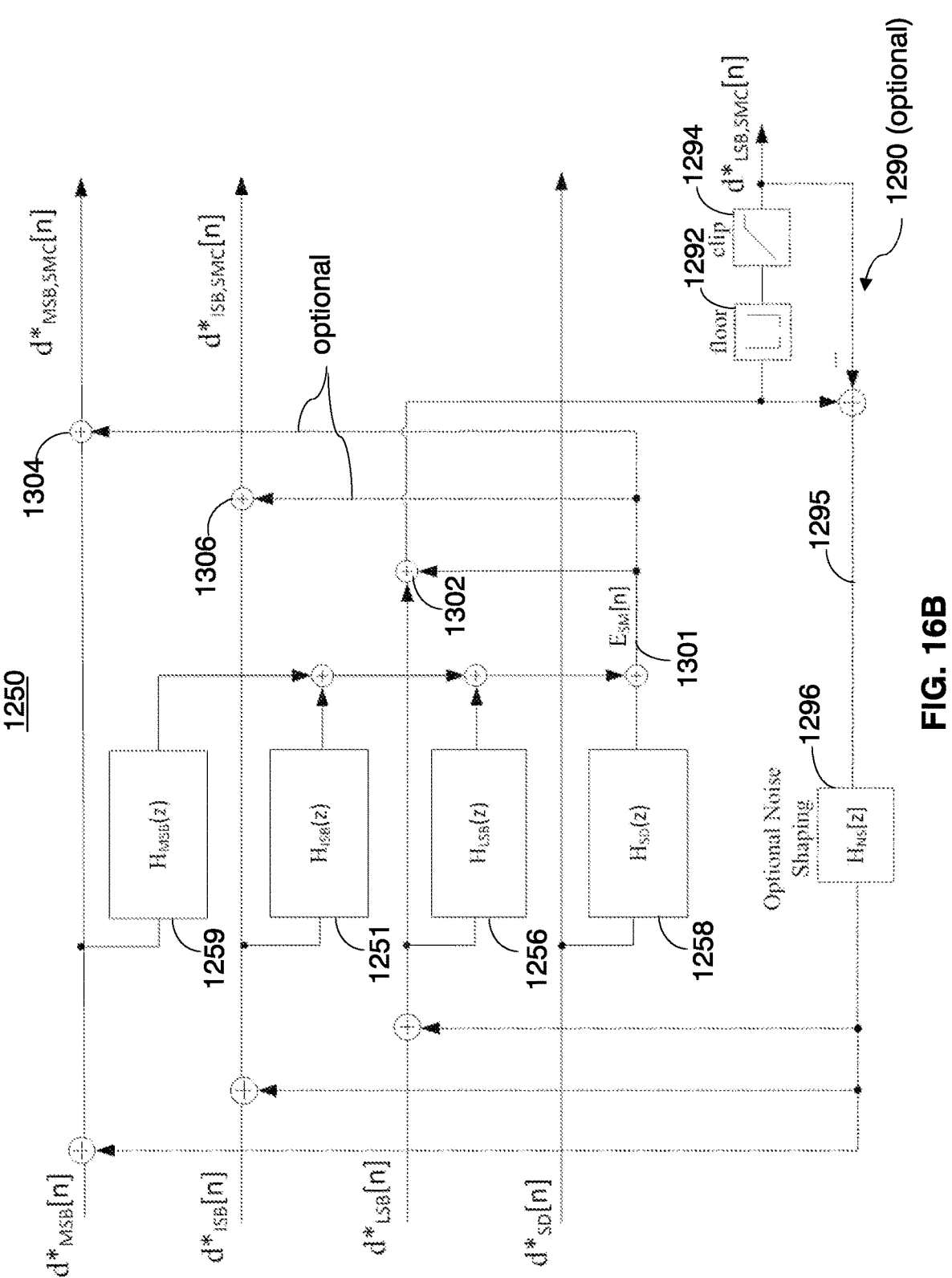
FIG. 16B shows a block diagram of a more generalized example DSMC for a DAC.

FIG. 16B shows a block diagram of a more generalized example DSMC for a DAC. In this example, the DSMC circuitry 1250 includes digital filters 1259, 1251, 1256, and 1258 for calculation of segment errors of the MSB segment, the ISB segment, the LSB segment, and the dither segment (i.e., the overrange DAC), respectively, as well as the optional noise shaping path 1290 for truncation errors on the modified LSB input data. The DSMC circuitry 1250 may be configured to calculate the errors of the MSB segment 1210, the ISB segment, the LSB segment 1220, and/or the overrange DAC 1230 using the filters 1259, 1251, 1256, and 1258, respectively, and combine any combination of one or more outputs of the filters 1259, 1251, 1256, and 1258 with one or more of the segment input data. The filters 1259, 1251, 1256, and 1258 process the MSB input data, the ISB input data, the LSB input data, and the overrange DAC cell input data, respectively, using the respective filter coefficients. The filter coefficients of the filters 1259, 1251, 1256, 1258 may be determined based on a measured error of the MSB segment, the ISB segment, the LSB segment, and the overrange DAC segment, respectively.

In one example, the outputs of the filters 1259, 1251, 1256, and 1258 (or any combination of one or more of them) are combined and the combined output 1301 of the filters 1259, 151, 1256, and 1258 is combined with the LSB input data by a combiner 1302. Alternatively, the combined output 1301 of the filters 1259, 151, 1256, and 1258 (or any combination of one or more of them) may also be combined with the ISB input data or the MSB and ISB input data by a combiner 1304, 1306 depending on the magnitude of the combined output 1301 of the filters 1259, 151, 1256, and 1258. For example, if the magnitude of the combined output 1301 is too big to overflow the LSB segment, the combined output 1301 may be added to the LSB and ISB input data, and if the combine output 1301 is too big to overflow the ISB segment as well, the combined output 1301 may be combined to the LSB, ISB, and MSB input data.

The DSMC 1250 may optionally include a feedback path 1290 for noise shaping of the truncation errors on the LSB input data. In this example, the modified LSB data (the LSB input data after combined with the combined output 1301) is truncated based on the resolution of the LSB segment by the circuits 1292 and 1294 and the truncation error 1295 (the difference between the input and output of the circuits 1292 and 1294) may be further processed by a noise shaping filter 1296 (optional) and may then be subtracted from the subsequent LSB input data, or from the subsequent LSB and ISB input data, or from the subsequent LSB, ISB, and MSB input data (or alternatively from the modified LSB, LSB and ISB, or LSB, ISB and MSB input data after combined with the combined output 1301) depending on the magnitude of the truncation error 1295.

The examples disclosed above can be extended to three and more segments. In this case, dither segments (overrange cells) may be added in between the segments which intersegment errors should be corrected and the number of paths are extended in the DSMC block accordingly.

FIG. 17 is a flow diagram of an example method for digital-to-analog conversion using a segmented DAC. The segmented DAC includes at least two DAC segments, and each DAC segment includes a plurality of DAC cells for generating an output signal contributing to an output of the segmented DAC. The segmented DAC includes at least one overrange DAC configured to generate a dither subtraction signal based on an overrange DAC control data. Input data is received for the segmented DAC (1702). A dither is added to the input data for the segmented DAC and overrange DAC control data is generated to compensate the dither (1704). A segment mismatch error is determined for at least one segment and/or the at least one overrange DAC (1706). The input data for the segmented DAC or input data for at least one segment is modified to correct the segment mismatch error of the at least one segment and/or the at least one overrange DAC (1708). The correction of the mismatch error may be limited to the segments of the main DAC and the mismatch error of the overrange DAC may or may not be corrected. Output signals of the at least two segments are generated based on modified input data to the at least two segments, and a dither subtraction signal is generated based on the overrange DAC control data (1710). The output signals of the at least two segments and the dither subtraction signal are combined in an analog domain (1712).

In some examples, the input data for one segment (e.g., an LSB segment) is processed with a first filter, and the overrange DAC control data is processed with a second filter, and an output of the first filter and/or an output of the second filter are combined with the input data for the LSB segment and/or other segment to generate modified input data for the LSB segment and/or other segment. In some examples, input data for at least one other segment is processed by at least one additional filter, and the output of the first filter, the output of the second filter, and/or an output of the at least one additional filter are combined with the input data for the LSB segment and/or other segment to generate the modified input data for the LSB segment and/or other segment.

In some examples, input data for an LSB segment is processed by a first filter, input data for an ISB segment is processed by a second filter, input data for an MSB segment is processed by a third filer, and the overrange DAC control data is processed by a fourth filter, and a combination of any one or more outputs of the first filter, the second filter, the third filter, and the fourth filter may be combined with the input data for the LSB segment to generate modified input data for the LSB segment. In some examples, the modified input data for the LSB segment may be truncated based on a resolution of the LSB segment and a truncation error may be subtracted from the modified input data for the LBS segment. The truncation error may be further processed by a noise shaping filter.

In some examples, the combination of any one or more outputs of the first filter, the second filter, the third filter, and the fourth filter may be combined with the input data for the ISB segment to generate modified input data for the ISB segment and/or with the input data for the MSB segment to generate modified input data for the MSB segment. The modified input data for the LSB segment may be truncated and a truncation error may be subtracted from the modified input data for the LBS segment, the modified input data for the ISB segment, and/or the modified input data for the MSB segment.

In some examples, validity of the modified input data for the segmented DAC or modified input data for at least one segment may be determined, and a control signal may be generated based on the validity determination, and dithering may be modified based on the control signal.

Figure 18:
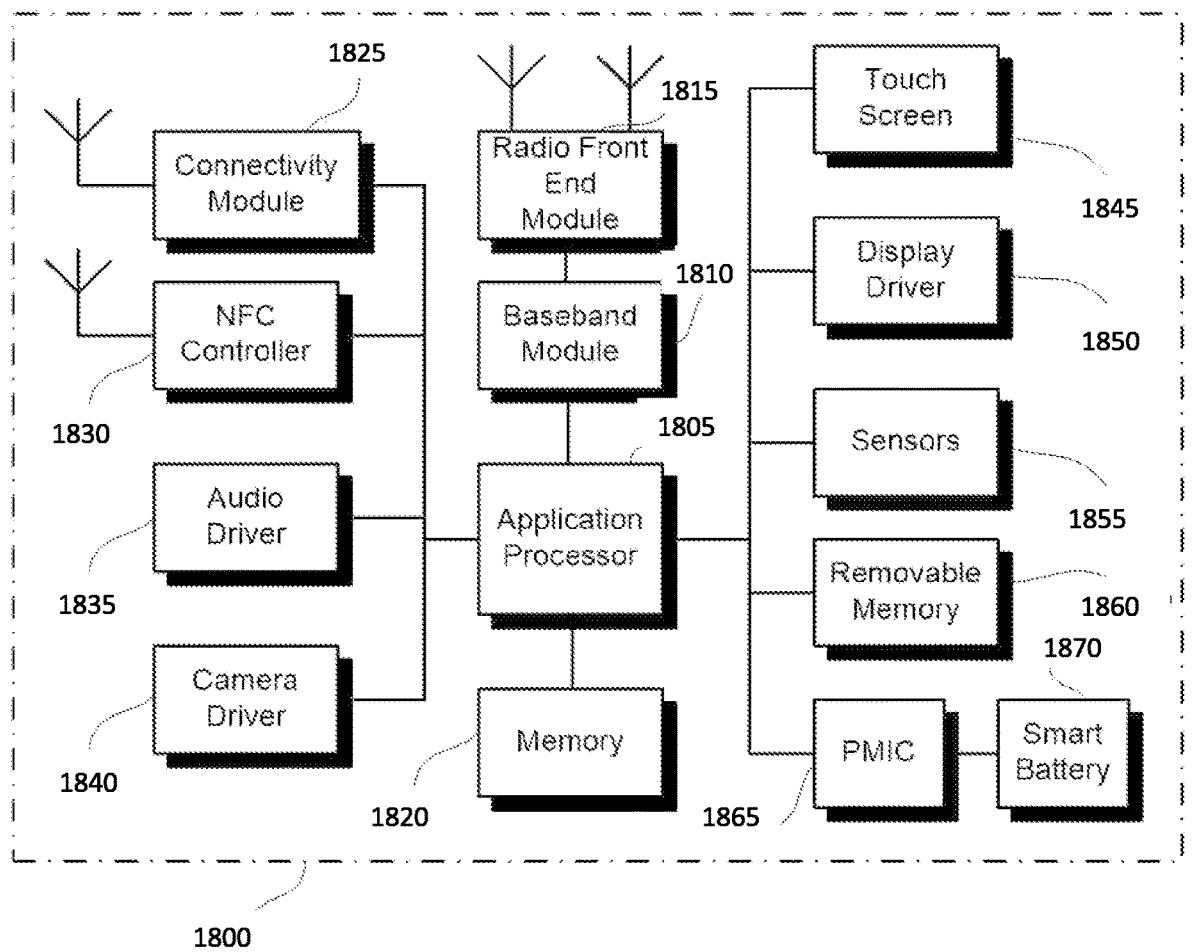
FIG. 18 illustrates a user device in which the examples disclosed herein may be implemented.

FIG. 18 illustrates a user device 1800 in which the examples disclosed herein may be implemented. For example, the examples disclosed herein may be implemented in the radio front-end module 1815, in the baseband module 1810, etc. The user device 1800 may be a mobile device in some aspects and includes an application processor 1805, baseband processor 1810 (also referred to as a baseband module), radio front end module (RFEM) 1815, memory 1820, connectivity module 1825, near field communication (NFC) controller 1830, audio driver 1835, camera driver 1840, touch screen 1845, display driver 1850, sensors 1855, removable memory 1860, power management integrated circuit (PMIC) 1865 and smart battery 1870.

In some aspects, application processor 1805 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1810 may be implemented, for example, as a solder-down substrate including one or more integrated circuits, a single packaged integrated circuit soldered to a main circuit board, and/or a multi-chip module containing two or more integrated circuits.

Figure 19:
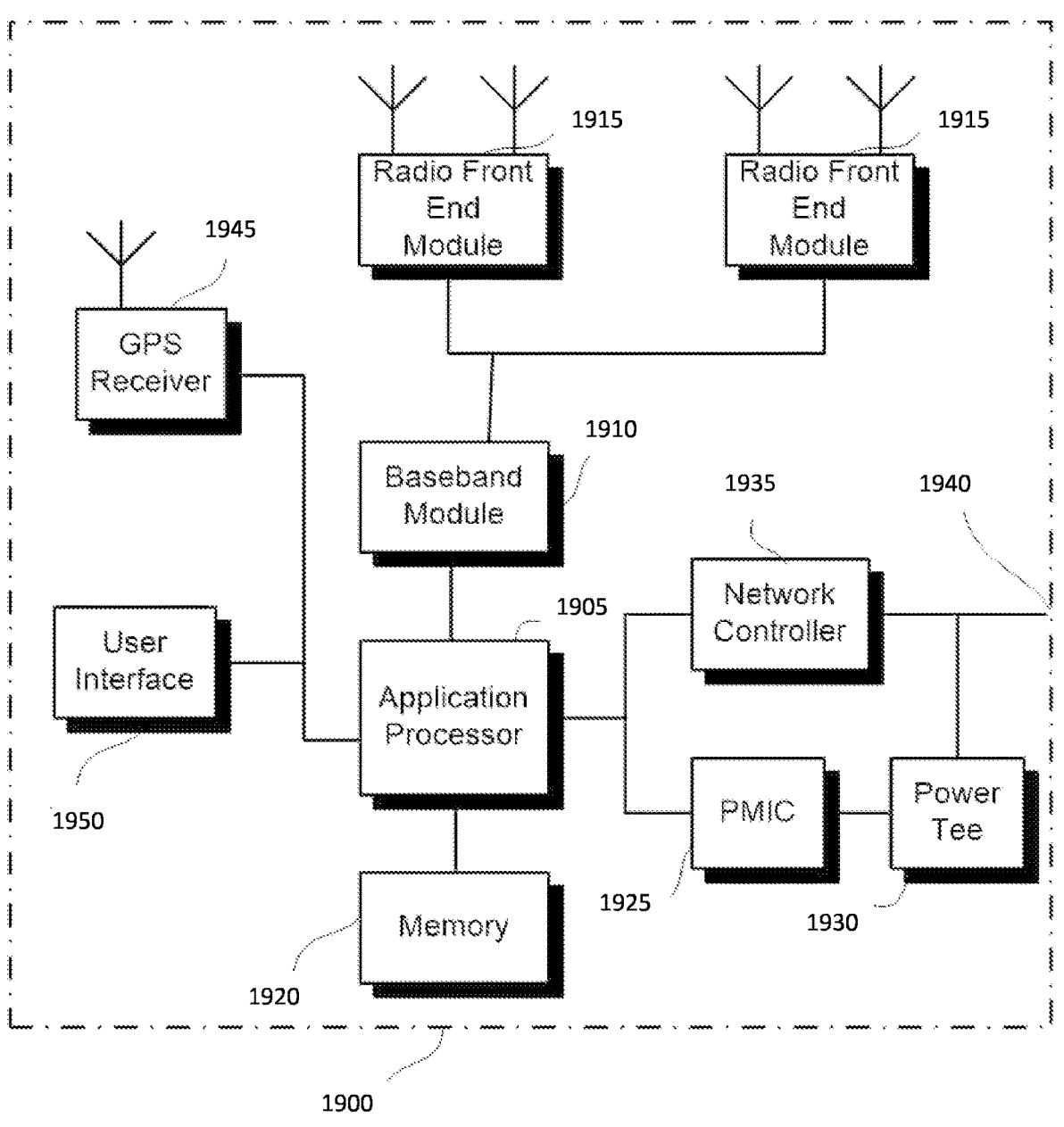
FIG. 19 illustrates a base station or infrastructure equipment radio head in which the examples disclosed herein may be implemented.

FIG. 19 illustrates a base station or infrastructure equipment radio head 1900 in which the examples disclosed herein may be implemented. For example, the examples disclosed herein may be implemented in the radio front-end module 1915, in the baseband module 1910, etc. The base station radio head 1900 may include one or more of application processor 1905, baseband modules 1910, one or more radio front end modules 1915, memory 1920, power management circuitry 1925, power tee circuitry 1930, network controller 1935, network interface connector 1940, satellite navigation receiver module 1945, and user interface 1950.

In some aspects, application processor 1905 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1910 may be implemented, for example, as a solder-down substrate including one or more integrated circuits, a single packaged integrated circuit soldered to a main circuit board or a multi-chip module containing two or more integrated circuits.

In some aspects, memory 1920 may include one or more of volatile memory including dynamic random access memory (DRAM) and/or synchronous dynamic random access memory (SDRAM), and nonvolatile memory (NVM)

including high-speed electrically erasable memory (commonly referred to as Flash memory), phase change random access memory (PRAM), magneto resistive random access memory (MRAM) and/or a three-dimensional crosspoint memory. Memory 1920 may be implemented as one or more of solder down packaged integrated circuits, socketed memory modules and plug-in memory cards.

In some aspects, power management integrated circuitry 1925 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1930 may provide for electrical power drawn from a network cable to provide both power supply and data connectivity to the base station radio head 1900 using a single cable.

In some aspects, network controller 1935 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1945 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1945 may provide data to application processor 1905 which may include one or more of position data or time data. Application processor 1905 may use time data to synchronize operations with other radio base stations.

In some aspects, user interface 1950 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a segmented DAC. The segmented DAC includes at least two segments, wherein each segment includes a plurality of DAC cells for generating an output signal contributing to an output of the segmented DAC, at least one overrange DAC configured to generate a dither subtraction signal based on an overrange DAC control data, wherein the dither subtraction signal of the overrange DAC is combined with the output signals of the at least two segments in an analog domain, a dither control circuit configured to add a dither to input data for the segmented DAC and generate the overrange DAC control data to compensate the dither, and a segment mismatch correction circuit configured to modify the input data for the segmented DAC or input data for at least one segment to correct a mismatch error of one or more segments and/or a mismatch error of the at least one overrange DAC.

Another example, (e.g., example 2) relates to a previously described example (e.g., example 1), wherein the segment mismatch correction circuit comprises a first filter for processing input data for one segment and a second filter for processing the overrange DAC control data and the segment mismatch correction circuit is configured to combine an output of the first filter and/or an output of the second filter with the input data for a least significant bit (LSB) segment to generate modified input data for the LSB segment.

Another example, (e.g., example 3) relates to a previously described example (e.g., example 2), wherein the segment mismatch correction circuit further comprises at least one additional filter for processing input data for at least one other segment and the segment mismatch correction circuit is configured to combine the output of the first filter, the output of the second filter, and/or an output of the at least one additional filter with the input data for the LSB segment to generate the modified input data for the LSB segment.

Another example, (e.g., example 4) relates to a previously described example (e.g., any one of examples 2-3), further comprising a truncation circuit for truncating the modified input data for the LSB segment based on a resolution of the LSB segment, and a circuitry for subtracting a truncation error from a subsequent modified input data for the LSB segment or a subsequent input data for the LSB segment.

Another example, (e.g., example 5) relates to a previously described example (e.g., example 4), wherein the segment mismatch correction circuit further comprises a noise shaping filter for processing the truncation error.

Another example, (e.g., example 6) relates to a previously described example (e.g., any one of examples 1-5), wherein the segment mismatch correction circuit comprises a first filter for processing input data for an LSB segment, a second filter for processing input data for an ISB segment, a third filter for processing input data for an MSB segment, and a fourth filter for processing the overrange DAC control data, and the segment mismatch correction circuit is configured to combine one or more outputs of the first, second, third, and fourth filters with the input data for the LSB segment to generate modified input data for the LSB segment.

Another example, (e.g., example 7) relates to a previously described example (e.g., example 6), further comprising a truncation circuit for truncating the modified input data for the LSB segment based on a resolution of the LSB segment, and a circuitry for subtracting a truncation error from a subsequent modified input data for the LSB segment or a subsequent input data for the LSB segment, or from a subsequent modified input data for the ISB segment or a subsequent input data for the ISB segment, or from a subsequent modified input data for the MSB segment or a subsequent input data for the MSB segment.

Another example, (e.g., example 8) relates to a previously described example (e.g., any one of examples 6-7), wherein the segment mismatch correction circuit is configured to combine the one or more output of the first, second, third, and fourth filters with the input data for the ISB segment to generate modified input data for the ISB segment, and/or with the input data for the MSB segment to generate modified input data for the MSB segment.

Another example, (e.g., example 9) relates to a previously described example (e.g., any one of examples 1-8), wherein the segment mismatch correction circuit further comprises a validity determination circuit configured to determine validity of the modified input data for the segmented DAC or modified input data for at least one segment and generate a control signal based on the validity determination, wherein the dither control circuit is configured to modify dithering based on the control signal.

Another example, (e.g., example 10) relates to a previously described example (e.g., any one of examples 1-9), wherein the dither control circuit is configured to add the dither to input data for a higher-order DAC segment and compensate the dither by modifying input data for a lower-order DAC segment and generate the overrange DAC control data.

Another example, (e.g., example 11) relates to a method for digital-to-analog conversion using a segmented DAC, wherein the segmented DAC includes at least two segments, and each segment includes a plurality of DAC cells for generating an output signal contributing to an output of the segmented DAC, and the segmented DAC includes at least one overrange DAC configured to generate a dither subtraction signal based on an overrange DAC control data. The method includes receiving input data for the segmented DAC, adding a dither to the input data for the segmented DAC, generating overrange DAC control data to compensate the dither, determining a segment mismatch error of at least one segment and/or a segment mismatch error of the at least one overrange DAC, modifying the input data for the segmented DAC or input data for at least one segment to correct the segment mismatch error of the at least one segment and/or the segment mismatch error of the at least one overrange DAC, generating output signals of the at least two segments based on modified input data to the at least two segments, generating a dither subtraction signal based on the overrange DAC control data, and combining the output signals of the at least two segments and the dither subtraction signal in an analog domain.

Another example, (e.g., example 12) relates to a previously described example (e.g., of example 11), wherein input data for one segment is processed with a first filter, and the overrange DAC control data is processed with a second filter, and an output of the first filter and/or an output of the second filter are combined with the input data for a least significant bit (LSB) segment to generate modified input data for the LSB segment.

Another example, (e.g., example 13) relates to a previously described example (e.g., example 12), wherein input data for at least one other segment is processed by at least one additional filter, and the output of the first filter, the output of the second filter, and/or an output of the at least one additional filter are combined with the input data for the LSB segment to generate the modified input data for the LSB segment.

Another example, (e.g., example 14) relates to a previously described example (e.g., example 13), further comprising truncating the modified input data for the LSB segment based on a resolution of the LSB segment and subtracting a truncation error from a subsequent modified input data for the LSB segment or a subsequent input data for the LSB segment.

Another example, (e.g., example 15) relates to a previously described example (e.g., example 14), wherein the truncation error is further processed by a noise shaping filter.

Another example, (e.g., example 16) relates to a previously described example (e.g., any one of examples 11-15), wherein input data for an LSB segment is processed by a first filter, input data for an ISB segment is processed by a second filter, input data for an MSB segment is processed by a third filer, and the overrange DAC control data is processed by a fourth filter, and one or more output of the first, second, third, and fourth filters are combined with the input data for the LSB segment to generate modified input data for the LSB segment.

Another example, (e.g., example 17) relates to a previously described example (e.g., example 16), further comprising truncating the modified input data for the LSB segment based on a resolution of the LSB segment and subtracting a truncation error from a subsequent modified input data for the LSB segment or a subsequent input data for the LSB segment, or from a subsequent modified input data for the ISB segment or a subsequent input data for the ISB segment, or from a subsequent modified input data for the MSB segment or a subsequent input data for the MSB segment.

Another example, (e.g., example 18) relates to a previously described example (e.g., any one of examples 16-17), wherein the one or more output of the first, second, third, and fourth filters are combined with the input data for the ISB segment to generate modified input data for the ISB segment and/or with the input data for the MSB segment to generate modified input data for the MSB segment.

Another example, (e.g., example 19) relates to a previously described example (e.g., any one of examples 11-18), further including determining validity of the modified input data for the segmented DAC or modified input data for at least one segment, generating a control signal based on the validity determination, and modifying dithering based on the control signal.

Another example, (e.g., example 20) relates to a non-transitory machine-readable storage including machine readable instructions, when executed, to implement a method as in any one of examples 11-19.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, —functions, -processes, —operations or —steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A segmented digital-to-analog converter (DAC), comprising:

at least two segments, wherein each segment includes a plurality of DAC cells for generating an output signal contributing to an output of the segmented DAC;

at least one overrange DAC configured to generate a dither subtraction signal based on an overrange DAC control data, wherein the dither subtraction signal of the overrange DAC is combined with the output signals of the at least two segments in an analog domain;

a dither control circuit configured to add a dither to input data for the segmented DAC and generate the overrange DAC control data to compensate the dither; and a segment mismatch correction circuit configured to modify the input data for the segmented DAC or input data for at least one segment to correct a mismatch error of one or more segments and/or a mismatch error of the at least one overrange DAC.

2. The segmented DAC of claim 1, wherein the segment mismatch correction circuit comprises a first filter for processing input data for one segment and a second filter for processing the overrange DAC control data and the segment mismatch correction circuit is configured to combine an output of the first filter and/or an output of the second filter with the input data for a least significant bit (LSB) segment to generate modified input data for the LSB segment.

3. The segmented DAC of claim 2, wherein the segment mismatch correction circuit further comprises at least one additional filter for processing input data for at least one other segment and the segment mismatch correction circuit is configured to combine the output of the first filter, the output of the second filter, and/or an output of the at least one additional filter with the input data for the LSB segment to generate the modified input data for the LSB segment.

4. The segmented DAC of claim 2, further comprising a truncation circuit for truncating the modified input data for the LSB segment based on a resolution of the LSB segment, and a circuitry for subtracting a truncation error from a subsequent modified input data for the LSB segment or a subsequent input data for the LSB segment.

5. The segmented DAC of claim 4, wherein the segment mismatch correction circuit further comprises a noise shaping filter for processing the truncation error.

6. The segmented DAC of claim 1, wherein the segment mismatch correction circuit comprises a first filter for processing input data for a least significant bit (LSB) segment, a second filter for processing input data for an intermediate significant bit (ISB) segment, a third filter for processing input data for a most significant bit (MSB) segment, and a fourth filter for processing the overrange DAC control data, and the segment mismatch correction circuit is configured to combine one or more outputs of the first, second, third, and fourth filters with the input data for the LSB segment to generate modified input data for the LSB segment.

7. The segmented DAC of claim 6, further comprising a truncation circuit for truncating the modified input data for the LSB segment based on a resolution of the LSB segment, and a circuitry for subtracting a truncation error from a subsequent modified input data for the LSB segment or a subsequent input data for the LSB segment, or from a subsequent modified input data for the ISB segment or a subsequent input data for the ISB segment, or from a subsequent modified input data for the MSB segment or a subsequent input data for the MSB segment.

8. The segmented DAC of claim 6, wherein the segment mismatch correction circuit is configured to combine the one or more output of the first, second, third, and fourth filters with the input data for the ISB segment to generate modified input data for the ISB segment, and/or with the input data for the MSB segment to generate modified input data for the MSB segment.

9. The segmented DAC of claim 1, wherein the segment mismatch correction circuit further comprises a validity determination circuit configured to determine validity of the modified input data for the segmented DAC or modified input data for at least one segment and generate a control signal based on the validity determination, wherein the dither control circuit is configured to modify dithering based on the control signal.

10. The segmented DAC of claim 1, wherein the dither control circuit is configured to add the dither to input data for a higher-order DAC segment and compensate the dither by modifying input data for a lower-order DAC segment and generate the overrange DAC control data.

11. A method for digital-to-analog conversion using a segmented digital-to-analog converter (DAC), wherein the segmented DAC includes at least two segments, and each segment includes a plurality of DAC cells for generating an output signal contributing to an output of the segmented DAC, and the segmented DAC includes at least one over-range DAC configured to generate a dither subtraction signal based on an overrange DAC control data, the method comprising:

receiving input data for the segmented DAC;

adding a dither to the input data for the segmented DAC;

generating overrange DAC control data to compensate the dither;

determining a segment mismatch error of at least one segment and/or a segment mismatch error of the at least one overrange DAC;

modifying the input data for the segmented DAC or input data for at least one segment to correct the segment mismatch error of the at least one segment and/or the segment mismatch error of the at least one overrange DAC;

generating output signals of the at least two segments based on modified input data to the at least two segments;

generating a dither subtraction signal based on the over-range DAC control data; and combining the output signals of the at least two segments and the dither subtraction signal in an analog domain.

12. The method of claim 11, wherein input data for one segment is processed with a first filter, and the overrange DAC control data is processed with a second filter, and an output of the first filter and/or an output of the second filter are combined with the input data for a least significant bit (LSB) segment to generate modified input data for the LSB segment.

13. The method of claim 12, wherein input data for at least one other segment is processed by at least one additional filter, and the output of the first filter, the output of the second filter, and/or an output of the at least one additional filter are combined with the input data for the LSB segment to generate the modified input data for the LSB segment.

14. The method of claim 13, further comprising truncating the modified input data for the LSB segment based on a resolution of the LSB segment and subtracting a truncation error from a subsequent modified input data for the LSB segment or a subsequent input data for the LSB segment.

15. The method of claim 14, wherein the truncation error is further processed by a noise shaping filter.

16. The method of claim 11, wherein input data for a least significant bit (LSB) segment is processed by a first filter, input data for an intermediate significant bit (ISB) segment is processed by a second filter, input data for a most significant bit (MSB) segment is processed by a third filer, and the overrange DAC control data is processed by a fourth filter, and one or more output of the first, second, third, and fourth filters are combined with the input data for the LSB segment to generate modified input data for the LSB segment.

17. The method of claim 16, further comprising truncating the modified input data for the LSB segment based on a resolution of the LSB segment and subtracting a truncation error from a subsequent modified input data for the LSB segment or a subsequent input data for the LSB segment, or from a subsequent modified input data for the ISB segment or a subsequent input data for the ISB segment, or from a subsequent modified input data for the MSB segment or a subsequent input data for the MSB segment.

18. The method of claim 16, wherein the one or more output of the first, second, third, and fourth filters are combined with the input data for the ISB segment to generate modified input data for the ISB segment and/or with the input data for the MSB segment to generate modified input data for the MSB segment.

19. The method of claim 11, further comprising:

determining validity of the modified input data for the segmented DAC or modified input data for at least one segment;

generating a control signal based on the validity determination; and modifying dithering based on the control signal.

20. A non-transitory machine-readable storage including machine readable instructions, when executed, to implement a method of claim 11.

* * * * *